(12) United States Patent
Cho et al.

(10) Patent No.: US 8,476,552 B2
(45) Date of Patent: Jul. 2, 2013

(54) LASER SYSTEMS AND METHODS USING TRIANGULAR-SHAPED TAILORED LASER PULSES FOR SELECTED TARGET CLASSES

(75) Inventors: Bong H. Cho, Beaverton, OR (US); Brian L. Pugh, Beaverton, OR (US); Andrew Hooper, Beaverton, OR (US)

(73) Assignee: Electro Scientific Industries, Inc., Portland, OR (US)

( * ) Notice: Subject to any disclaimer, the term of this patent is extended or adjusted under 35 U.S.C. 154(b) by 446 days.

(21) Appl. No.: 12/753,659

(22) Filed: Apr. 2, 2010

(65) Prior Publication Data

US 2010/0276405 A1    Nov. 4, 2010

Related U.S. Application Data

(63) Continuation-in-part of application No. 12/060,076, filed on Mar. 31, 2008.

(51) Int. Cl.
*B23K 26/00* (2006.01)

(52) U.S. Cl.
USPC ............................... 219/121.67; 219/121.72

(58) Field of Classification Search
USPC ............... 219/121.61–121.71, 121.83, 121.6, 219/121.72, 121.73, 121.85; 372/25, 30; 264/400
See application file for complete search history.

(56) References Cited

U.S. PATENT DOCUMENTS

| | | | |
|---|---|---|---|
| 5,004,890 A | 4/1991 | Lim | |
| 5,376,770 A | 12/1994 | Kuhl et al. | |
| 5,642,374 A | 6/1997 | Wakabayashi et al. | |
| 6,054,235 A | 4/2000 | Bryan et al. | |
| 6,243,405 B1 | 6/2001 | Borneis et al. | |
| 6,281,471 B1 | 8/2001 | Smart | |
| 6,479,788 B1 | 11/2002 | Arai et al. | |
| 6,574,250 B2 | 6/2003 | Sun et al. | |
| 6,595,985 B1 | 7/2003 | Tobinick | |
| 6,661,820 B1 | 12/2003 | Camilleri et al. | |
| 6,727,458 B2 | 4/2004 | Smart | |
| 6,961,355 B1 | 11/2005 | Yin et al. | |
| 7,126,746 B2 | 10/2006 | Sun et al. | |
| 7,173,212 B1 | 2/2007 | Semak | |
| 7,244,906 B2 | 7/2007 | Jordens et al. | |
| 7,348,516 B2 | 3/2008 | Sun et al. | |
| 7,428,253 B2 | 9/2008 | Murison et al. | |

(Continued)

FOREIGN PATENT DOCUMENTS

WO    2008014331 A2    1/2008

OTHER PUBLICATIONS

Office Action of Mar. 17, 2011, for U.S. Appl. No. 12/060,076, filed Mar. 31, 2008.

(Continued)

*Primary Examiner* — Minh-Loan T Tran
*Assistant Examiner* — Fazli Erdem
(74) *Attorney, Agent, or Firm* — Stoel Rives LLP

(57) ABSTRACT

Processing workpieces such as semiconductor wafers or other materials with a laser includes selecting a target to process that corresponds to a target class associated with a predefined temporal pulse profile. At least one of the predefined temporal pulse profiles may be triangular. The target class may include, for example unpassivated electrically conductive links or other bare metal structures. Based on the target class associated with the selected target, a laser pulse is generated having a triangular temporal pulse profile. The generated laser pulse is used to process the selected structure.

20 Claims, 21 Drawing Sheets

U.S. PATENT DOCUMENTS

| | | |
|---|---|---|
| 7,817,685 B2 | 10/2010 | Osako et al. |
| 2002/0167581 A1 | 11/2002 | Cordingley et al. |
| 2005/0067388 A1 | 3/2005 | Sun et al. |
| 2005/0272184 A1* | 12/2005 | Hiramatsu et al. ............ 438/149 |
| 2006/0126678 A1 | 6/2006 | Sun et al. |
| 2006/0159138 A1 | 7/2006 | Deladurantaye et al. |
| 2007/0045253 A1* | 3/2007 | Jordens et al. ........... 219/121.71 |
| 2008/0067155 A1 | 3/2008 | Gu |
| 2008/0164240 A1 | 7/2008 | Cordingley et al. |
| 2008/0181269 A1* | 7/2008 | Osako et al. .................... 372/30 |
| 2008/0203071 A1 | 8/2008 | Sun et al. |
| 2009/0126870 A1 | 5/2009 | Zadoyan et al. |
| 2009/0245301 A1 | 10/2009 | Peng et al. |
| 2010/0009550 A1 | 1/2010 | Tsujikawa et al. |

OTHER PUBLICATIONS

International Search Report and Written Opinion, mailed Nov. 30, 2011 for PCT/US2011/030350, filed Mar. 29, 2011.

Office Action, mailed Jul. 27, 2011 for U.S. Appl. No. 12/060,076, filed Mar. 31, 2008.

Notice of Allowance and Fee(s) due mailed Apr. 12, 2013, for U.S. Appl. No. 13/076,810, filed Mar. 31, 2011.

Notice of Allowance and Fee(s) due mailed May 14, 2013, for U.S. Appl. No. 12/060,076, filed Mar. 31, 2008.

* cited by examiner

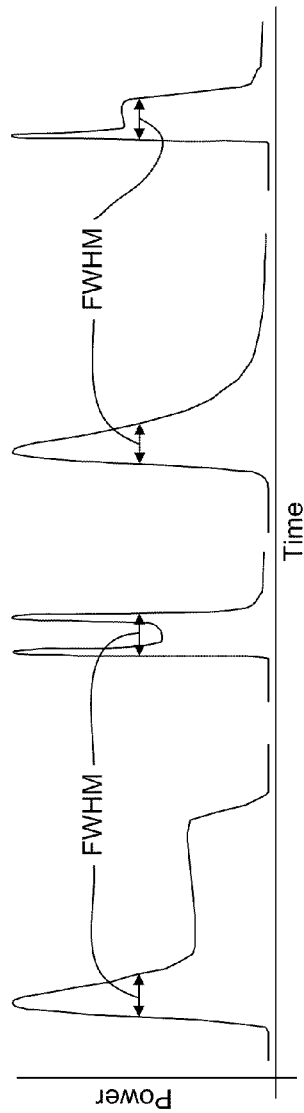
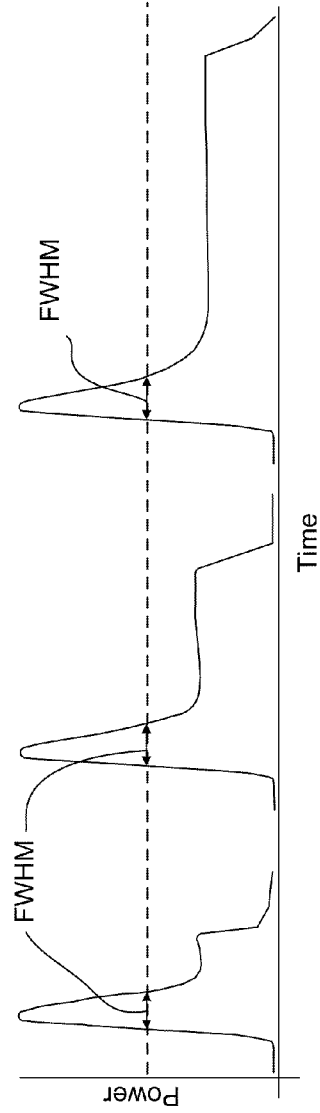
FIG. 18A
FIG. 18B

US 8,476,552 B2

LASER SYSTEMS AND METHODS USING TRIANGULAR-SHAPED TAILORED LASER PULSES FOR SELECTED TARGET CLASSES

RELATED APPLICATION

This application is a continuation-in-part of U.S. patent application Ser. No. 12/060,076, titled "Methods and Systems for Dynamically Generating Tailored Laser Pulses," filed Mar. 31, 2008, which is hereby incorporated by references herein.

TECHNICAL FIELD

This disclosure relates to laser processing systems. In particular, this disclosure relates to laser systems and methods for severing electrically conductive links and/or micromachining semiconductor devices with laser pulses having shaped temporal profiles.

BACKGROUND INFORMATION

Laser processing systems employed for processing dynamic random access memory (DRAM) and other semiconductor devices commonly use a Q-switched diode pumped solid state laser. When processing memory devices, for example, a single laser pulse is commonly employed to sever an electrically conductive link structure. In other industrial applications, laser scribing is used to remove metal and dielectric semiconductor materials from a semiconductor device wafer prior to dicing. Lasers may also be used, for example, to trim resistance values of discrete and embedded components.

Some laser processing systems use different operating modes to perform different functions. For example, the ESI Model 9830 available from Electro Scientific Industries, Inc. of Portland, Oreg., the assignee of the present patent application, uses a diode pumped Q-switched neodymium-doped yttrium vandate (Nd:YVO$_4$) laser operating at a pulse repetition frequency of approximately 50 kHz for laser processing of semiconductor memory and related devices. This laser system provides a pulsed laser output for processing link structures and a continuous wave (CW) laser output for scanning beam-to-work targets. As another example, the ESI Model 9835, also available from Electro Scientific Industries, Inc., uses a diode pumped Q-switched, frequency-tripled Nd:YVO$_4$ laser for laser processing semiconductor memory and related devices. This laser system uses a first pulsed laser output at a PRF of approximately 50 kHz for processing link structures and a second pulsed laser output at a PRF of approximately 90 kHz for scanning beam-to-work targets. In some systems, higher PRFs (e.g., approximately 100 kHz) are also possible. Generally, the pulse widths of laser pulses generated by such laser systems are functionally dependent on the PRF selected and are not independently adjustable based on differences between target structures or other process variables.

FIGS. 1A and 1B are example temporal pulse shapes of laser pulses generated by typical solid state lasers. The pulse shown in FIG. 1A may have been shaped by optical elements as is known in the art to produce a square-wave pulse. As shown in Table 1 and in FIGS. 1A and 1B, a typical solid state pulse shape is well described by its peak power, pulse energy (time integration of the power curve), and pulse width measured at a full-width half-maximum (FWHM) value. Feedback from a pulse detector may be used to determine pulse energy and/or peak power. The pulse detector used for feedback may include a diode coupled to an analog peak capture-and-hold circuit for peak power sensing. The pulse detector may also include an analog integration circuit for pulse energy measurements.

Many memory devices and other semiconductor devices include a dielectric passivation material that covers the electrically conductive link structures. The overlying passivation material helps to contain the metallic link material so that it can be heated above an ablation threshold. For example, FIGS. 2A, 2B, 2C, and 2D are cross-sectional block diagrams of a semiconductor device 200 that includes passivated electrically conductive link structures 210, 212, 214. As shown in FIG. 1A, the semiconductor device 200 may include one or more layers of dielectric passivation material 216 formed over a semiconductor substrate 218. In this example, the semiconductor substrate 218 comprises silicon (Si), the dielectric material comprises silicon dioxide (SiO$_2$), and the electrically conductive link structures 210, 212, 214 comprise Aluminum (Al). Generally, the electrically conductive link structures 210, 212, 214 are located within the dielectric material 216. In other words, the dielectric material is adjacent to both top and bottom surfaces of the electrically conductive link structures 210, 212, 214 such that the electrically conductive link structures 210, 212, 214 are not directly exposed to a processing laser beam 220. Rather, the laser beam 220 passes through an overlying portion of the dielectric passivation material 216 before interacting with a selected electrically conductive link structure 212.

In FIG. 2A, interaction between the laser beam 220 and the selected electrically conductive link structure 212 causes the electrically conductive link structure 212 to heat up. Heating causes pressure inside the electrically conductive link structure 212 to increase. The dielectric passivation material 216 traps the heat and prevents portions of the heated electrically conductive link structure 212 from being ejected onto the adjacent electrically conductive link structures 210, 214. In other words, the dielectric passivation material 216 prevents liquified portions of the electrically conductive link structure 212 from "splashing" onto other portions of the semiconductor device 200. For illustrative purposes, FIG. 2B shows an enlarged view of a portion of the dielectric passivation material 216 surrounding the electrically conductive link structure 212. As shown in FIG. 2B, continued heating may cause cracks 222 to open from upper corners of the electrically conductive link structure 212. Once the electrically conductive link structure 212 reaches an ablation threshold, as shown in FIG. 2C, the electrically conductive link structure 212 may explode, which may cause the overlying dielectric passivation material 216 and portions of the electrically conductive link structure 212 to be removed as vapor 224. As shown in FIG. 2D, the laser beam 220 may then clean out remaining portions of the electrically conductive link structure 212, if any, through boiling, melting, and/or splashing.

While an overlying passivation layer keeps the electrically conductive link material contained until it heats above the ablation threshold, it may be difficult to sufficiently control passivation thickness. Integrated circuit (IC) manufactures generally invest a considerable amount of effort into forming the passivation layer thickness into a suitable range for processing. Without the overlying passivation material (e.g., when processing an unpassivated or bare metal link), however, laser processing generates metal splash that can form an electrical connection (e.g., a short circuit or electrically conductive bridge) with an adjacent electrically conductive link structure, which may result in a device failure. For example, FIG. 3 is an electron micrograph showing unpassivated link structures 310 having an area 312 where adjacent links have melted together during laser processing using a Gaussian-shaped pulse. In this example, the unpassivated link structures 310 comprise aluminum and are about 4 μm wide (about 1 μm pitch). FIG. 3 also shows an area 314 where a blown link resulted in excessive debris. In addition to splash and bridge issues, unpassivated electrically conductive link structures may have smaller process windows when compared to passivated electrically conductive link structures.

Other laser processing applications may also suffer from splashing. For example, laser scribing may be used to remove metal and dielectric semiconductor materials from a semiconductor device wafer prior to dicing. If thick or unpassivated metals are present in an area to be scribed, the process window may be greatly reduced due to metal splash and/or metal melt and reflow into the scribed area. For example, FIG. 4 is an electron micrograph showing an unpassivated copper wire 410 (Cu) on silicon (Si) 412 that was scribed with a plurality of Gaussian shaped pulses. A kerf 414 scribed by the laser pulses has poorly defined edges because the copper melted and reflowed into the kerf 414 (shown at arrow 416). FIG. 4 also shows that scribing the bare metal copper wire 410 created excessive debris (shown at arrows 418). The laser scribe rate may be slowed down to address problems with metal splash, reflow, cracking, and delamination, which may significantly impact scribing throughput.

SUMMARY OF THE DISCLOSURE

A method for processing a workpiece with a laser includes storing data corresponding to a plurality of temporal pulse profiles. Each temporal pulse profile may be associated with a respective target class of structure on or within the workpiece. At least one of the plurality of temporal pulse profiles includes a triangular shape that increases at a first constant rate from an initial power value at a first time to a peak power value at a second time, and decreases at a second constant rate from the peak power value at the second time back to the initial power value at a third time. The method further includes selecting a structure on or within the workpiece for processing. The selected structure may be associated with the temporal pulse profile having the triangular shape. Based on the selected structure, the temporal pulse profile that includes the triangular shape is selected from among the plurality of temporal pulse profiles. A laser pulse is generated that includes the selected temporal pulse profile. The generated laser pulse is directed to the workpiece so as to process the selected structure with the generated laser pulse.

Additional aspects and advantages will be apparent from the following detailed description of preferred embodiments, which proceeds with reference to the accompanying drawings.

BRIEF DESCRIPTION OF THE DRAWINGS

FIGS. 18A and 18B illustrate a problem stemming from using peak power and FWHM to characterize tailored laser pulses.

DETAILED DESCRIPTION OF PREFERRED EMBODIMENTS

Figure 1A:
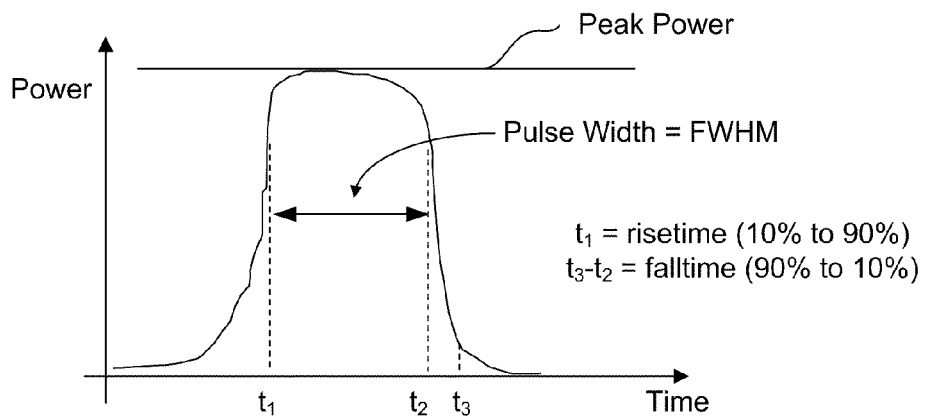
FIGS. 1A and 1B are example temporal pulse shapes of laser pulses generated by typical solid state lasers.
Figure 1B:
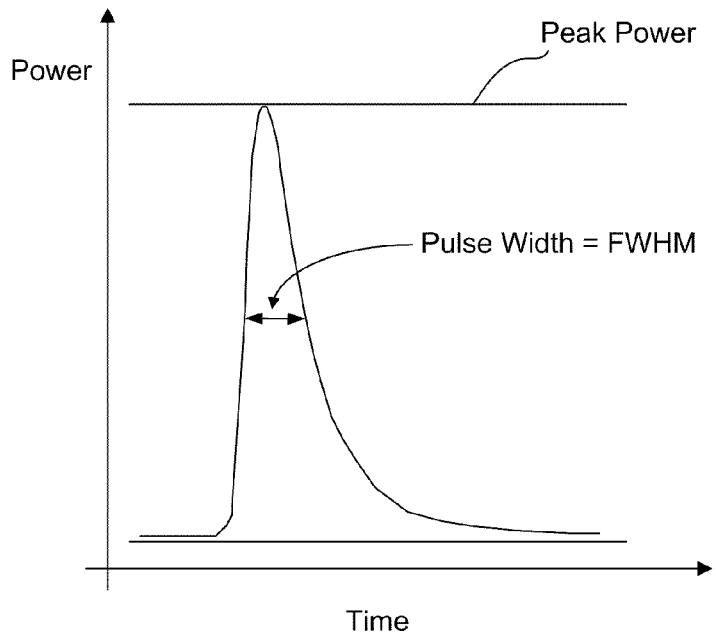
Figure 2A:
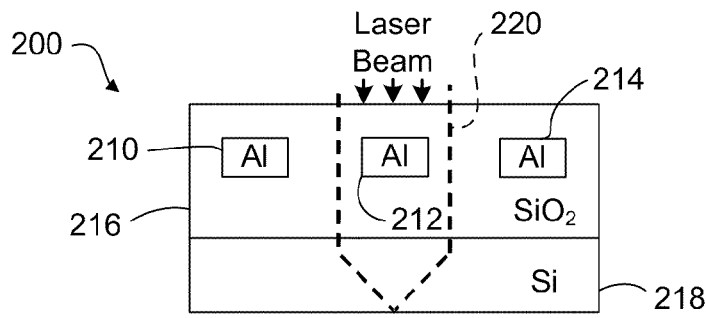
FIGS. 2A, 2B, 2C, and 2D are cross-sectional block diagrams of a semiconductor device that includes passivated electrically conductive link structures.
Figure 2B:
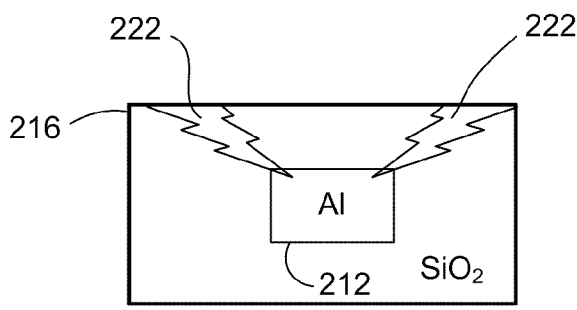
Figure 2C:
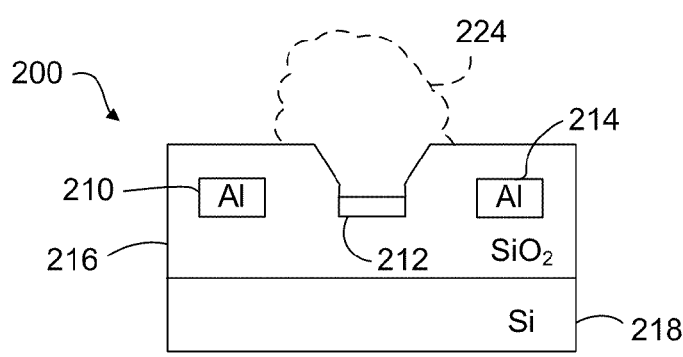
Figure 2D:
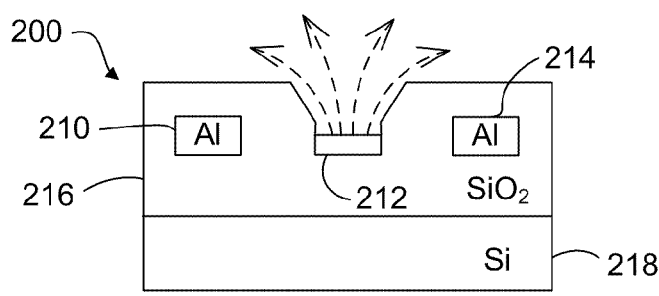
Figure 3:
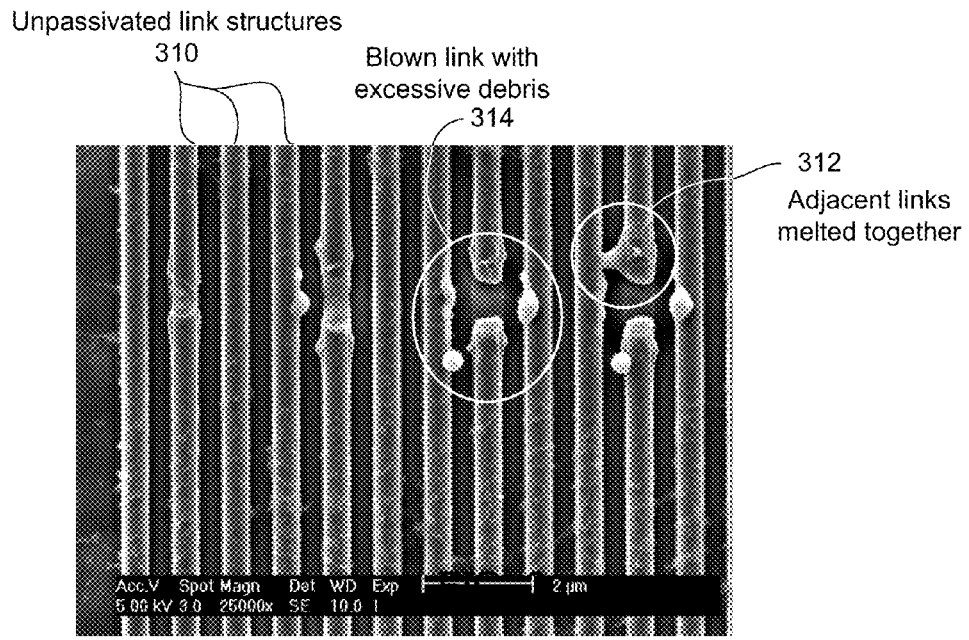
FIG. 3 is an electron micrograph showing unpassivated link structures having an area where adjacent links have melted together during laser processing using a Gaussian-shaped pulse.
Figure 4:
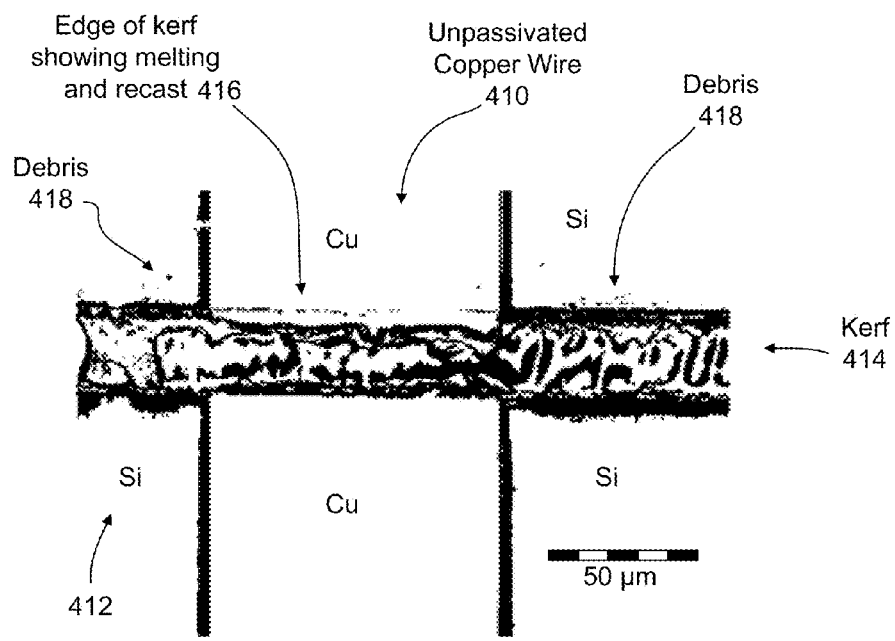
FIG. 4 is an electron micrograph showing an unpassivated copper wire on silicon that was scribed with a plurality of Gaussian shaped pulses.

This disclosure describes processing unpassivated electrically conductive link structures and other structures on semiconductor devices using laser pulses with triangular-shaped temporal pulse profiles (e.g., power vs. time). As discussed in detail below, a "triangular-shaped" temporal pulse profile includes a profile having equal rise and fall times (e.g., symmetrical triangle shape), as well as sawtooth-shaped temporal pulse profiles where the rise time does not equal the fall time (e.g., an asymmetrical triangle shape). Thus, for an asymmetrical (sawtooth) triangular-shaped temporal pulse profile, the pulse's maximum peak power is located somewhere other than at the center (in time) of the pulse.

In certain embodiments, laser pulses having triangular-shaped temporal pulse profiles may be generated using, for example, the lasers and systems described in U.S. Pat. No. 7,348,516, which is assigned to the assignee of the present patent application, and which is hereby incorporated herein in its entirety. Other example laser system embodiments for generating tailored laser pulses with triangular-shaped temporal pulse profiles are described below.

In certain embodiments, families or classes of temporal pulse profiles may be defined for different types of target structures. For symmetrical triangle shapes, families of pulse shapes can be generated by maintaining a constant pulse duration (e.g., temporal width) while increasing or decreasing the maximum peak value. Additional families for the symmetrical triangle shape may be created, for example, by using different pulse durations while maintaining, increasing, or decreasing the maximum peak value. For asymmetrical triangle shapes, families of pulse shapes may be generated by changing pulse durations and/or maximum peak values. Additional families for the asymmetrical triangle shape may be created by, for example, moving the time of the maximum peak value and/or changing the rise and/or fall times.

In certain embodiments, data corresponding to the various families of temporal pulse profiles may be stored in a memory device of a laser processing system to be used to generate pulse shapes for processing unpassivated electrically conductive link structures or to scribe semiconductor device layers. In one embodiment, a process window for a particular type of device or target class of structure may be determined by running a matrix of different pulse shapes on the device or target class of structure. Such an embodiment may be used to determine the parameters (e.g., pulse width, maximum peak value, rise time, and fall time) of the triangular-shaped temporal pulse profile.

In addition, or in other embodiments, this disclosure describes selecting laser pulses with tailored temporal pulse profiles based on target structures, and providing sufficient feedback and control so as to maintain a desired intensity profile. In one embodiment, a laser processing system uses multiple temporal profiles to process workpiece structures (e.g., electrically conductive links) on one or more workpieces. The laser processing system may include a pulsed laser such as a fiber laser, a master oscillator fiber power amplifier (MOFPA), a tandem photonic amplifier, or a "sliced" pulse laser that uses an electro-optical modulator (see the description herein related to FIGS. 18 and 19) with programmable temporal pulse profiles that allow the laser to generate laser pulses in a wide range of shapes. The laser processing system may be configured to select a laser pulse shape "on-the-fly" when the laser is directed to emit a laser pulse toward a specific workpiece structure.

In certain embodiments, the laser processing system calibrates the energy per pulse and other laser parameters, such as signal propagation delays, which may vary with the programmed temporal profile. The laser processing system may be calibrated to operate reliably over a range of programmed temporal pulse profiles. Thus, in one such embodiment, the laser processing system uses a photoelectronic detection method that digitizes the pulse waveform so as to provide an accurate calibration of the energy per pulse as a function of the programmed pulse shape.

As discussed above, a typical Q-switched solid state pulse shape is well described by its peak power, pulse energy, and pulse width (e.g., FWHM). Generally, however, these metrics are not sufficient for describing the temporal pulse shapes possible with a tailored pulse laser. For example, the peak power of a spike on the power curve does not describe the height of a "seat" on the so-called chair-shaped pulse or the height of a second peak on a double spiked pulse.

Thus, in certain embodiments, the laser processing system includes feedback for parameters that typical link processing systems do not monitor. By providing such feedback, a number of pulse shape metrics may be logged and correlated with process feedback (e.g., device yield and substrate damage). This provides a valuable tool for developing new processes and new pulse shapes to further enhance the value of the tailored pulse technology. In addition, or in other embodiments, the pulse shape metrics are used to monitor and control the pulse shapes based on the feedback.

Reference is now made to the figures in which like reference numerals refer to like elements. In the following description, numerous specific details are provided for a thorough understanding of the embodiments disclosed herein. However, those skilled in the art will recognize that the embodiments can be practiced without one or more of the specific details, or with other methods, components, or materials. Further, in some cases, well-known structures, materials, or operations are not shown or described in detail in order to avoid obscuring aspects of the embodiments. Furthermore, the described features, structures, or characteristics may be combined in any suitable manner in one or more embodiments.

I. Triangular-Shaped Temporal Pulse Profiles

In one embodiment, triangular-shaped pulses are used to process unpassivated electrically conductive link structures and other structures. Triangular-shaped pulses produce a steady increase and decrease in temperature. Although this disclosure describes processing unpassivated electrically conductive link structures as an example embodiment, skilled artisans will recognized from the disclosure herein that other structures may be processed and other types of processing may also be performed using triangular-shaped pulses. For example, and not by way of limitation, triangular-shaped pulses may be used to process passivated electrically conductive link structures or to scribe semiconductor device layers having bare wires.

Figure 5:
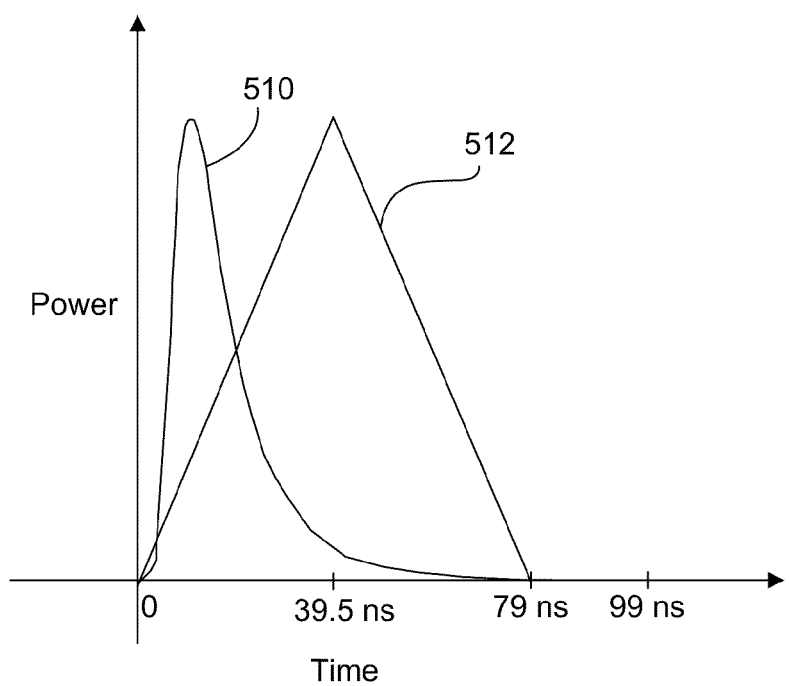
FIG. 5 graphically illustrates differences between a Gaussian-shaped temporal pulse profile and a triangular-shaped temporal pulse profile that may be used according to certain embodiments.

FIG. 5 graphically illustrates differences between a Gaussian-shaped temporal pulse profile 510 and a triangular-shaped temporal pulse profile 512 that may be used according to certain embodiments. As shown in FIG. 5, the Gaussian-shaped temporal pulse profile 510 does not increase at a constant rate from its initial value to a maximum peak value. Further, Gaussian-shaped temporal pulse profile 510 does not decrease at a constant rate from its maximum peak value back to the initial power value. Rather, the Gaussian-shaped temporal pulse profile 510 curves at a changing rate, particularly near the maximum peak value and as it returns to the initial power value. Further, the Gaussian-shaped temporal pulse profile 510 has rapid rise and fall times as compared to the rise and fall times of the triangular-shaped temporal pulse profile 512 of the same temporal pulsewidth (e.g., 79 ns in this example). Thus, as described in detail below, the Gaussian-shaped temporal pulse profile 510 produces a "thermal shock" that causes splashing and debris when processing unpassivated electrically conductive link structures.

The triangular-shaped temporal pulse profile 512, on the other hand, increases at a first constant rate from its initial power value at a first time (time zero in this example) to a maximum peak value at a second time (39.5 ns in this example). Further, the triangular-shaped temporal pulse profile 512 decreases at a second constant rate from the maximum peak power value at the second time back to the initial power value at a third time (79 ns in this example). In this example, the triangular-shaped temporal pulse profile 512 is symmetrical such that the increasing first constant rate is substantially equal to the decreasing second constant rate. The triangular-shaped temporal pulse profile 512 produces a slower steady state temperature ramp (both up and down in temperature) than that produced by the Gaussian-shaped temporal pulse profile 510. The slower steady state temperature ramp reduces the thermal shock that causes splashing during processing of unpassivated electrically conductive link structures. Further, the longer (slower) ramp down in temperature provided by the triangular-shaped temporal pulse profile 512, as compared to the Gaussian-shaped temporal pulse profile 510, reduces or prevents the rapid solidification of materials surrounding the process area. This may help to reduce stress around the process area caused by the rapid solidification of dielectrics or metal residue remaining in the process area.

Figure 6:
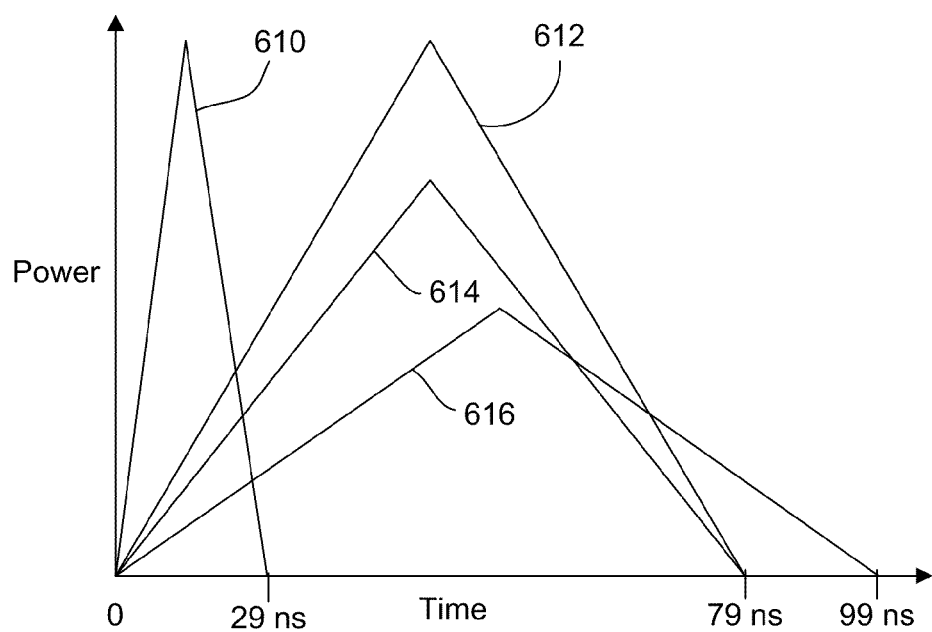
FIG. 6 graphically illustrates a plurality of symmetrical triangular-shaped temporal pulse profiles according to certain example embodiments.

FIG. 6 graphically illustrates a plurality of symmetrical triangular-shaped temporal pulse profiles 610, 612, 614, 616 according to certain example embodiments. The triangular-shaped temporal pulse profile 610 has a 29 ns pulse duration. The triangular-shaped temporal pulse profile 612 has a 79 ns pulse duration. In this example the maximum peak amplitude of the triangular-shaped temporal pulse profile 612 is substantially equal to the maximum peak amplitude of the triangular-shaped temporal pulse profile 610. The triangular-shaped temporal pulse profile 614 also has a 79 ns pulse duration. However, the maximum peak amplitude of the triangular-shaped temporal pulse profile 614 is about 75% of the maximum peak amplitude of the triangular-shaped temporal pulse profile 612. Thus, the triangular-shaped temporal pulse profile 614 maintains the same pulse shape and duration as those of the triangular-shaped temporal pulse profile 612, while varying its peak height. The triangular-shaped temporal pulse profile 616 has a 99 ns duration and a maximum peak amplitude that is about 50% of the maximum peak amplitude of the triangular-shaped temporal pulse profile 612.

Figure 7:
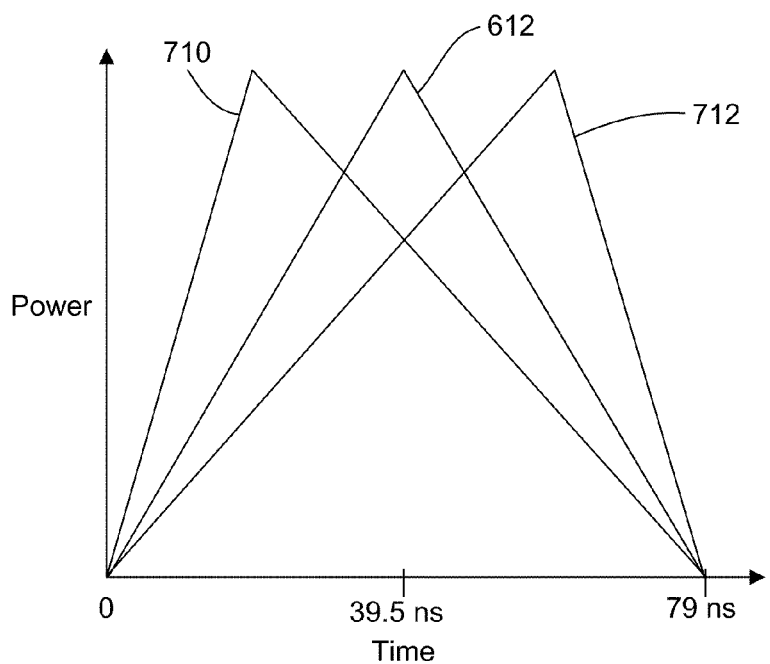
FIG. 7 graphically illustrates asymmetrical triangular-shaped temporal pulse profiles according to certain example embodiments.

FIG. 7 graphically illustrates asymmetrical triangular-shaped temporal pulse profiles 710, 712 according to certain example embodiments. The asymmetrical triangular-shaped temporal pulse profiles 710, 712 are illustrated in relation to the symmetrical triangular-shaped temporal pulse profile 612 shown in FIG. 6. The asymmetrical triangular-shaped temporal pulse profiles 710, 712 may also be referred to herein as sawtooth-shaped temporal pulse profiles. Like the symmetrical triangular-shaped temporal pulse profile 612, the asymmetrical triangular-shaped temporal pulse profiles 710, 712 each have a 79 ns pulse duration. The asymmetrical triangular-shaped temporal pulse profile 710 has a fast rise time as compared with its fall time. Thus, while the symmetrical triangular-shaped temporal pulse profile 612 has a maximum peak amplitude at about 39 ns, the asymmetrical triangular-shaped temporal pulse profile 710 has a maximum peak amplitude substantially below about 39 ns. The asymmetrical triangular-shaped temporal pulse profile 712 has a slow rise time as compared with its rise time. Thus, the asymmetrical triangular-shaped temporal pulse profile 712 has a maximum peak amplitude substantially above 39 ns.

Artisans will recognize from the disclosure herein that the triangular-shaped temporal pulse profiles 610, 612, 614, 616, 710, 712 shown in FIGS. 6 and 7, including the illustrated pulse durations, are provided by way of example only, and not by limitation. Indeed, an artisan will recognize that a triangular-shaped temporal pulse profile of any duration, amplitude, or degree of asymmetry may be used for a particular laser processing application.

Figure 8:
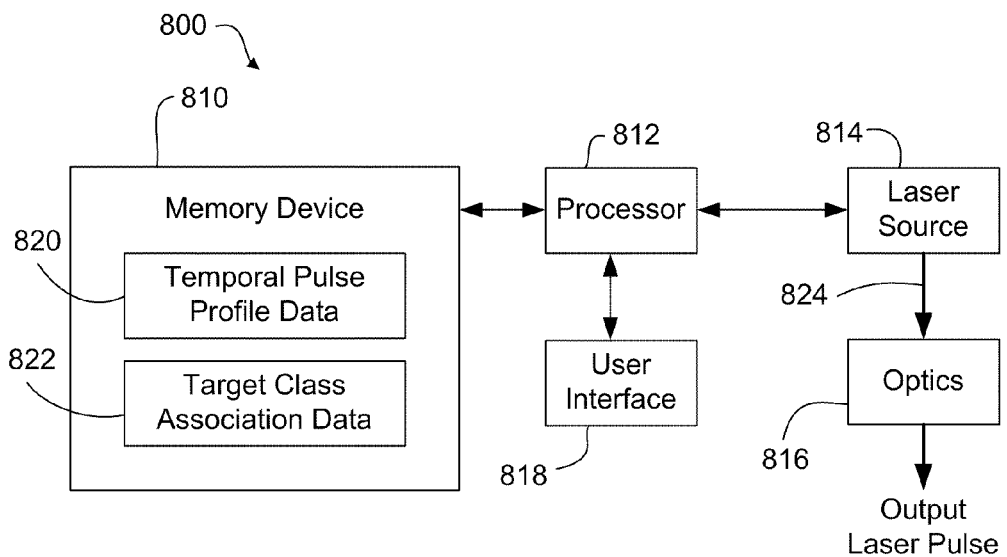
FIG. 8 is a simplified block diagram of a laser processing system according to one embodiment.

In certain embodiments, families or classes of symmetrical and/or asymmetrical triangular-shaped temporal pulse profiles may be defined for different types of target structures. For example, FIG. 8 is a simplified block diagram of a laser processing system 800 according to one embodiment. The laser processing system 800 includes a memory device 810, a processor 812, a laser source 814, optics 816, and a user interface 818. The processor 812 may be a general-purpose or special-purpose computer (or other electronic device) configured to execute computer-readable instructions (e.g., stored in the memory device 810 or another computer-readable storage medium) to perform the processes described herein. The processor 812 may be embodied as a microprocessor, a microcontroller, a digital signal processor (DSP), or other device known in the art.

The memory device 820 may store temporal pulse profile data 820 that defines a plurality of different temporal pulse profiles that the laser source 814 is capable of generating. The temporal pulse profile data 820 may define, for example, the symmetrical and asymmetrical triangular-shaped temporal pulse profiles 612, 614, 616, 710, 712 shown in FIGS. 6 and 7, other specific symmetrical or asymmetrical triangular-shaped temporal pulse profiles, and/or any of the other types of temporal pulse profiles described herein. In some embodiments, a user may interact with the processor 812 through the user interface 818 to define custom temporal pulse profiles or to alter the parameters (e.g., pulse duration, power amplitude, symmetry, and other parameters defining shape) of predetermined or default temporal pulse profiles stored in the memory device 810 as temporal pulse profile data 820.

The memory device 810 may also store target class association data 822. The target class association data 822 associates one or more of the temporal pulse profiles defined by the temporal pulse profile data 820 with corresponding target class structures. For example, the target class association data 822 may associate the asymmetrical triangular-shaped temporal pulse profile 712 shown in FIG. 7 with a particular type of unpassivated electrically conductive link structure. In some embodiments, a user may interact with the processor 812 through the user interface 818 to define new target class associations or to modify predetermined or default settings in the target class association data 822.

During operation, the processor 812 selects a structure on or within a workpiece (not shown) for processing. For example, the processor 812 may select a next electrically conductive link to blow based on test data. Based on the target class association data 822, the processor 812 selects the temporal pulse profile data 820 corresponding to the selected structure. The laser source 814 then generates a laser pulse 824 based on the selected temporal pulse profile data 820. Examples of how the laser source 814 generates desired pulse shapes are provided below. The optics 816 then direct the generated laser pulse 824 to the workpiece so as to process the selected structure. The optics 816 may include, for example, mirrors, focusing lenses, electro-optic or acousto-optic deflectors and/or modulators, fast-steering mirrors, galvanometer-driven mirrors, and other optical devices that may be coordinated with translation stages (e.g., X, Y, and/or Z stages) to provide the generated pulse to the selected structure.

FIGS. 9A, 9B, 9C, and 9D schematically illustrate steps for laser processing a target material 910 such as a bare metal wire or an unpassivated link structure according to certain embodiments. The illustrated steps show the effects of processing such target materials 910 with a pulse having a Gaussian-shaped temporal pulse profile. Then, differences in the laser process are described for embodiments using a pulse with a triangular-shaped temporal pulse profile.

Figure 9A:
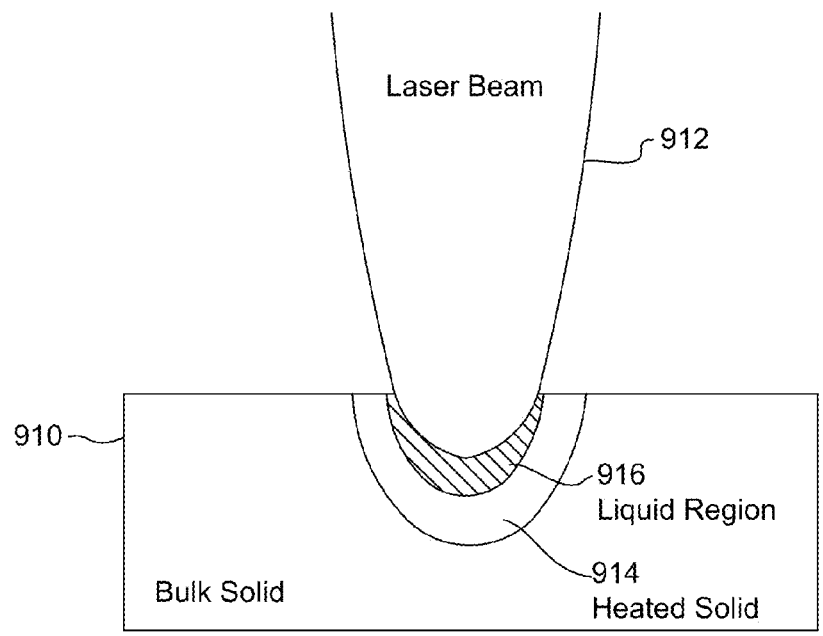
FIGS. 9A, 9B, 9C, and 9D schematically illustrate steps for laser processing a target material such as a bare metal wire or an unpassivated link structure according to certain embodiments.

As shown in FIG. 9A, applying a laser beam pulse 912 having a Gaussian-shaped temporal pulse profile initially produces melting as the target material 910 begins to absorb the laser energy. If the rate of heating of the target material 910 is faster than the rate of thermal conduction into the surrounding materials, then a localized area 914 of the target material 910 begins to heat up. Eventually, the temperature reaches the melting temperature and a portion of the target material 910 melts to form a liquefied layer or region 916.

Figure 9B:
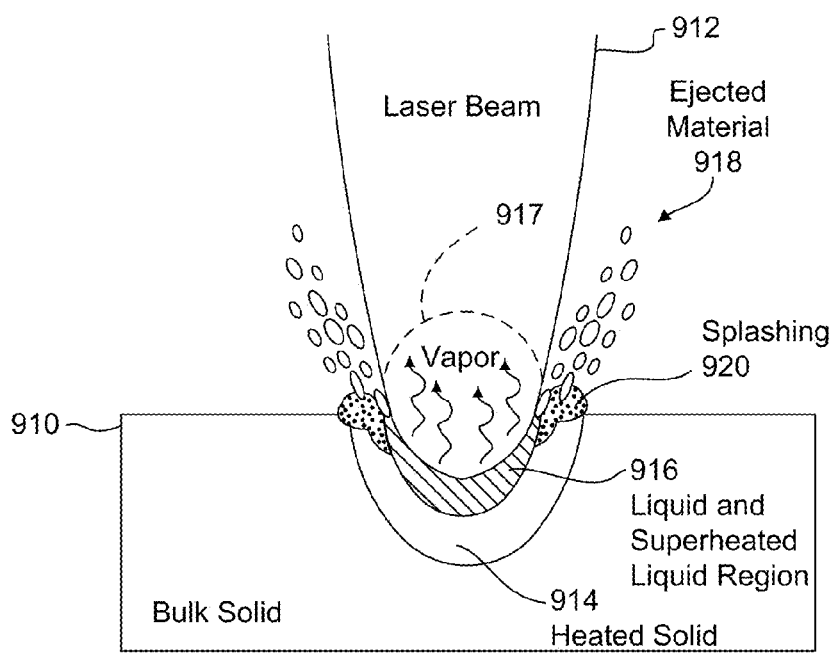

As shown in FIG. 9B, the laser beam pulse 912 having the Gaussian-shaped temporal pulse profile then causes boiling and removal of some material. As the target material continues to heat up, some of the liquefied layer 916 reaches the boiling temperature, resulting in removal by ablation or vaporization 917. The ablation process causes turbulence in the liquefied layer 916 (e.g., by bubble formation, recoil pressure, and other processes) resulting in removal of ejected material 918 and splashing 922 of the liquefied layer 916. For cases when the target material 910 is heated very rapidly, some portion of the liquefied layer 916 can become heated above the melting point resulting in formation of a superheated metastable liquid (which can lead to a process called "explosive boiling").

Figure 9C:
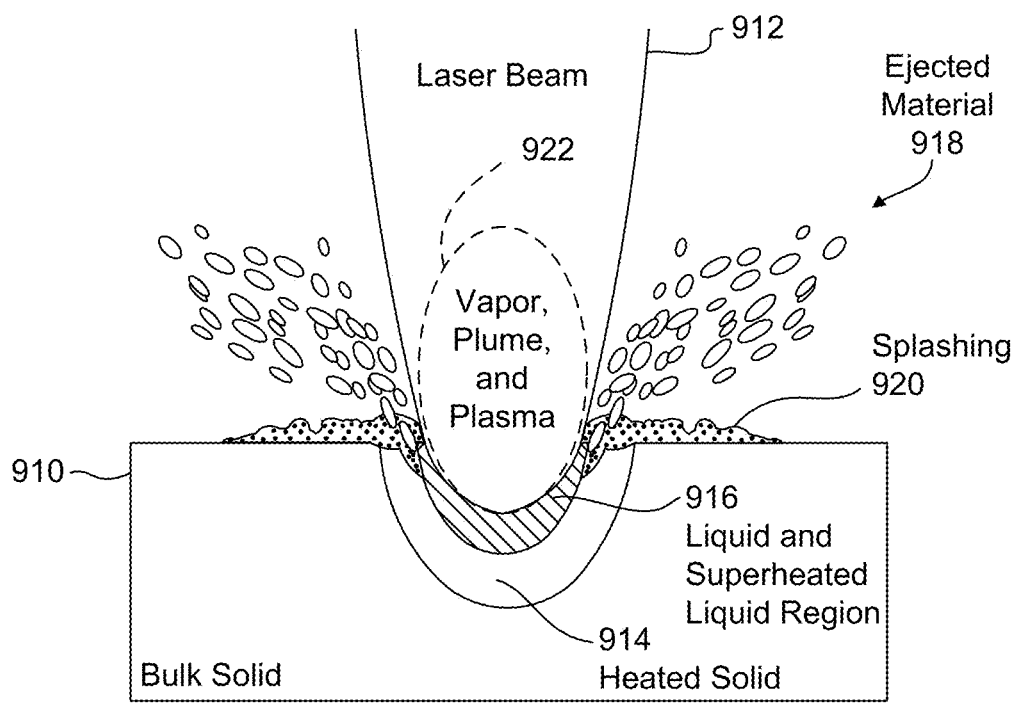

As shown in FIG. 9C, the laser beam pulse 912 having the Gaussian-shaped temporal pulse profile then causes plume and plasma formation. As the amount of ablated material increases, eventually a "cloud" 922 of material forms above the surface called the "plume". The plume attenuates the laser energy reaching the work surface by scattering and absorbing the laser energy. As more energy is added, the plume material may become plasma. If the plasma is generated close enough to the work surface, then additional removal of ejected material 918 and splashing 920 of material can result from indirect heating from the plasma.

Figure 9D:
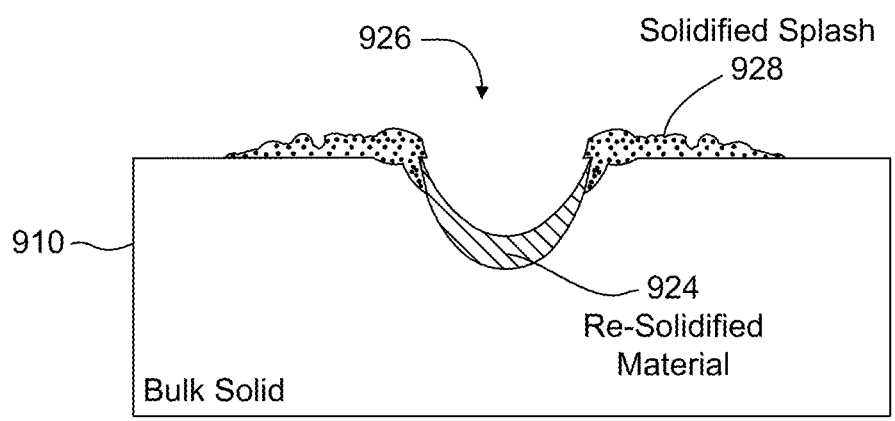

FIG. 9D illustrates the target material 910 after the laser beam pulse 912 has ended and the target material 910 is in a cooldown phase. As the laser energy of the laser beam pulse 912 having the Gaussian-shaped temporal pulse profile is decreased, the rate of heating of the target material 910 eventually becomes slower than the rate of heat conduction to the surrounding materials. At this point, remaining portions of the liquefied layer 916 begin to cool down and re-solidify. FIG. 9D illustrates the re-solidified material 924 within a kerf 926 created by the laser process, as well as solidified splash 928 on the surrounding surfaces.

By way of contrast with using the laser beam pulse 912 having the Gaussian-shaped temporal pulse profile described in FIGS. 9A, 9B, 9C, 9D, using a laser pulse having a triangular-shaped temporal pulse profile according to certain embodiments produces more gradual rates of heating and cooling of the target material 910. This reduces or avoids effects that cause splash at the different steps shown in FIGS. 9A, 9B, 9C, 9D.

For example, referring again to FIG. 9B, the gradual or slower heating produced by the laser pulse having a triangular-shaped temporal pulse profile reduces the formation of the superheated liquified layer 916. Superheated liquids can undergo a very violent and explosive bubble formation process (called explosive boiling) causing an eruption of liquid and vapor material from the surface. By reducing the degree of superheating using a slower heating rate, the laser pulse having a triangular-shaped temporal pulse profile produces substantially less splashing 920 as that produced by the laser beam pulse 912 having the Gaussian-shaped temporal pulse profile.

In addition, referring again to FIG. 9C, the gradual or slower heating produced by the laser pulse having a triangular-shaped temporal pulse profile causes a substantially less intense plasma cloud 922 formation. This further reduces or eliminates splashing 920 due to indirect heating from the plasma cloud 922

Further, referring again to FIG. 9D, the gradual cooldown produced by the laser pulse having a triangular-shaped temporal pulse profile gives any resulting melted material an opportunity to reflow, which results in a smoother appearance of the re-solidified material 924. This slow cooldown also causes annealing of the surface, which substantially reduces the stresses between the re-solidified material 924 and the surrounding material. In comparison, the rapid cooling produced by the laser beam pulse 912 having the Gaussian-shaped temporal pulse profile causes the liquified layer 916 to rapidly freeze, which results in a rough and highly stressed surface.

Because the thermal and thermal diffusion properties can be different for different types of semiconductor device stacks, the selected rate of heating may be different for each case. Thus, certain embodiments may use symmetrical triangular-shaped temporal pulse profiles and other embodiments may use asymmetrical triangular-shaped (sawtooth-shaped) temporal pulse profiles. The upwards ramp of the pulse controls the rate of heating and the effects described in relation to FIGS. 9A, 9B, and 9C. The downward ramp of the pulse controls the effects described in relation to FIG. 9D. The selected pulse shape may be highly dependent on the materials and the arrangement of the materials being cut.

Figure 10:
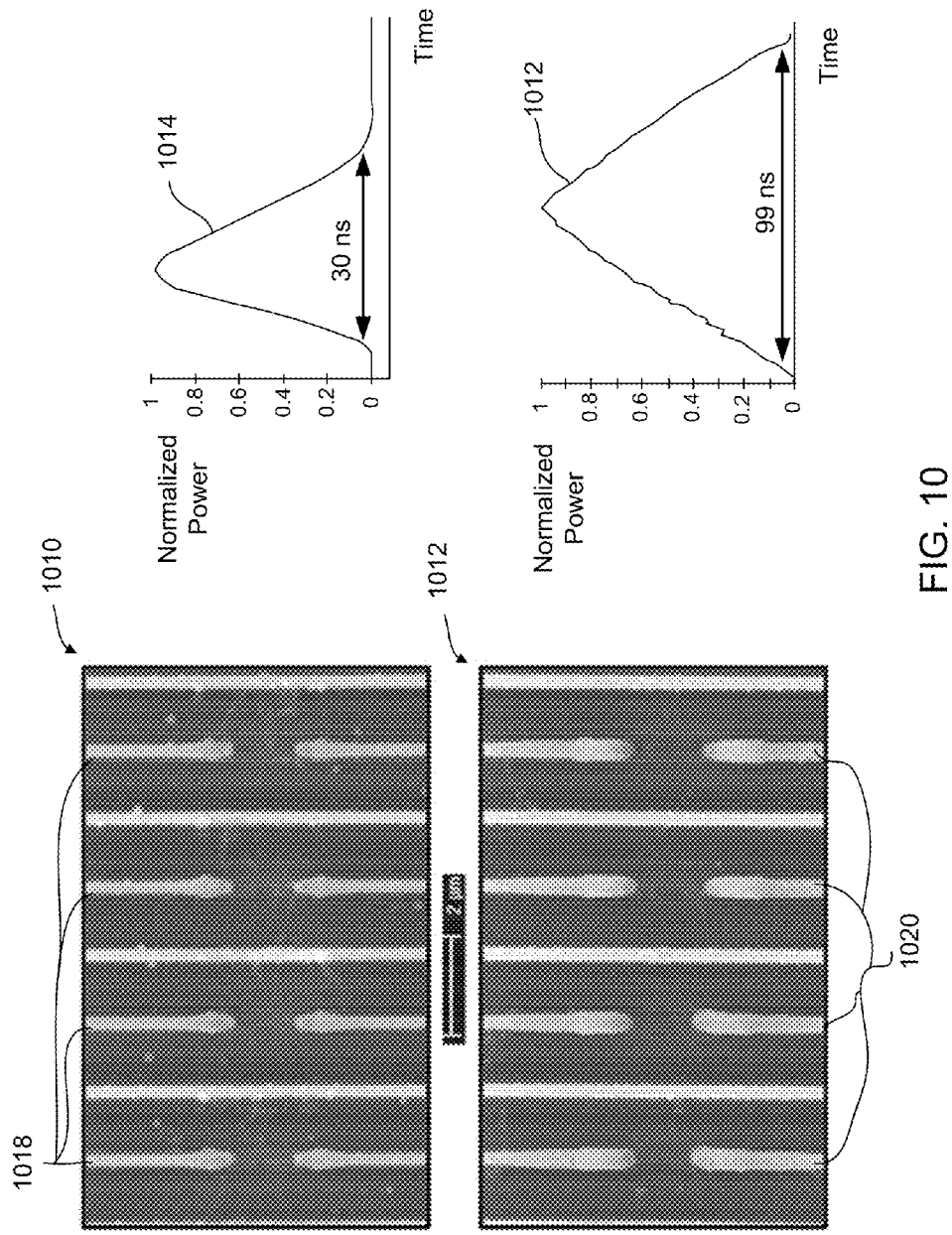
FIG. 10 illustrates example electron micrographs and corresponding temporal pulse profiles according to certain embodiments.

FIG. 10 illustrates example electron micrographs 1010, 1012 and corresponding temporal pulse profiles 1014, 1016 according to certain embodiments. Severed links 1018 shown in the electron micrograph 1010 were processed using laser pulses having the Gaussian-shaped temporal pulse profile 1014. Severed links 1020 shown in the electron micrograph 1012 were produced using laser pulses having the triangular-shaped temporal pulse profile 1016. The triangular-shaped temporal pulse profile 1016 shown in FIG. 10 includes some noise. Even with the noise, however, triangular-shaped temporal pulse profile 1016 has a substantial constant rise time and a substantially constant fall time.

As shown in the electron micrograph 1010, pulses having the Gaussian-shaped temporal pulse profile 1014 produce splashier cuts in the metal links 1018, including circular balls of ejected material that may be observed at distances more than about 1 μm from the cut area. By way of comparison with the electron micrograph 1010, the electron micrograph 1012 shows that pulses having the triangular-shaped temporal pulse profile 1016 produce relatively less splash due to the slower rate of heating.

Also, the edges of the cut links 1018 (e.g., comprising aluminum) of the electron micrograph 1010 show melting and deformation that are more angular-shaped, which relates to pulse cool down time. The edges of the cut links 1020 shown in the micrograph 1012, and produced using the pulses having the triangular-shaped temporal pulse profile 1016 are more rounded. The aluminum materials in this example cool down very rapidly for the Gaussian pulse resulting in a more angular shape, while the slow rate of cooling from the triangular-shaped pulse allows the metal ends to reflow forming a more rounded and smoother cut edge.

II. Programmable Temporal Pulse Profiles

Some systems have used tailored pulse shapes to process workpieces. For example, U.S. Pat. No. 7,348,516, which is assigned to the assignee of the present patent application, describes one such laser technology in which laser processing of conductive links on memory chips or other integrated circuit (IC) chips is accomplished by laser systems and methods employing laser pulses with a specially tailored intensity profile (pulse shape) for better processing quality and yield. As another example, U.S. Pat. No. 7,126,746, which is assigned to the assignee of the present patent application, describes a method of employing a laser processing system that is capable of using multiple laser pulse temporal profiles to process semiconductor workpiece structures on one or more semiconductor wafers.

Generally, in a link processing system there are several laser pulse parameters that define the laser-material interaction. In addition to laser wavelength, these parameters include both spatial characteristics (e.g., spot size, waist location, and ellipticity) as well as temporal characteristics (e.g., peak power, pulse energy, pulse width, and pulse shape). In order to provide a robust process that can be repeated on multiple link processing systems, the laser pulse parameters may be: (a) passively controlled by design and measured during manufacturing to verify performance; (b) controlled through calibrations performed periodically; or (c) actively measured and controlled with a feedback loop. In certain laser processing systems, such as a tailored pulse laser processing system, method (c) may provide more flexibility than methods (a) or (b).

Typical laser processing systems generally monitor the various laser parameters in different ways. For example, Table 1 summarizes the current state of the art with respect to laser pulse process parameter control.

TABLE 1

| Type | Parameter | Method | Notes |
|------|-----------|--------|-------|
| Spatial | Spot Size | (b) Calibration | Calibrated as part of the "Programmable Spot (PS) Calibration" during manufacturing and preventative maintenance. Systems can be configured to monitor spot size periodically, but feedback correction is generally not allowed. |
| Spatial | Waist Location | (c) Feedback | Measured during wafer alignment and controlled at runtime by moving the objective lens with z-stage. |
| Spatial | Ellipticity | (a) Passive | Measured during PS Calibration. There may also be automated adjustments. |
| Spatial | Asymmetry | (a) Passive | Measured during PS Calibration. There may also be automated adjustments. |
| Temporal | Pulse Energy | (c) Feedback | Default system configuration allows for runtime feedback of pulse energy as measured by a pulse detector and as controlled with an acousto-optic modulator (AOM). |
| Temporal | Peak Power | (c) Feedback (optional) | System can be configured to allow runtime feedback of peak power instead of pulse energy using the pulse detector. This is generally optional. |
| Temporal | Pulse Width | (a) Passive | Considered constant for a given laser architecture operating at the same laser repetition rate. Measured during manufacturing to confirm that the parameter is within specification. |
| Temporal | Pulse Shape | N/A | For solid state lasers, peak height (e.g., peak power), pulse energy, and pulse width sufficiently describe the temporal shape. For a tailored pulse system, however, this is not true. |

Figure 11A:
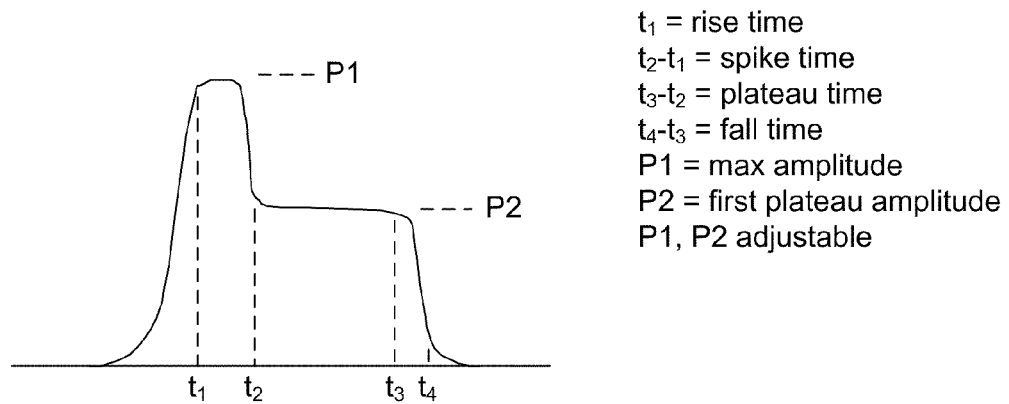
FIGS. 11A and 11B are example temporal pulse shapes of tailored laser pulses generated by a dynamic laser pulse shaper and power amplifier according to one embodiment.
Figure 11B:
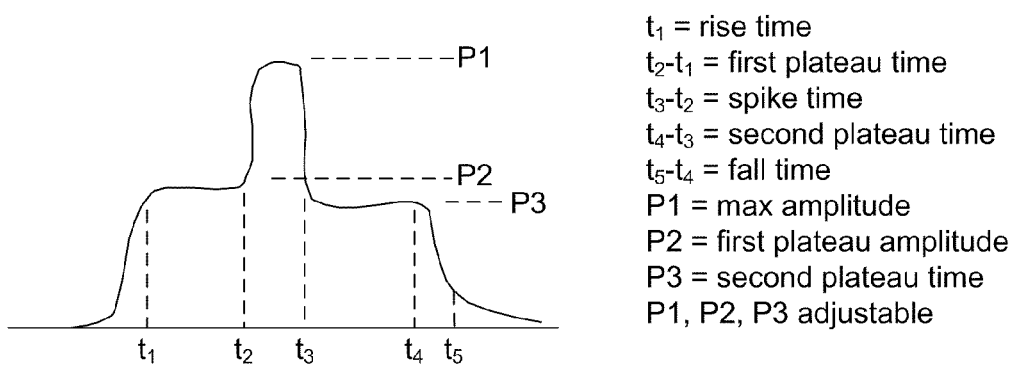

Unlike using a solid state laser to generate typical laser pulses, tailored pulse technology using, for example, a fiber laser or master oscillator fiber power amplifier (MOFPA) allows for pulse shapes that are not adequately described by typical peak power, pulse energy, and pulse width metrics. For example, FIGS. 11A and 11B are example temporal pulse shapes of tailored laser pulses generated by a dynamic laser pulse shaper and power amplifier according to one embodiment. As shown in FIG. 11A, a peak power P1 of a leading spike on the power curve does not describe the height of a plateau or "seat" power P2 on the so-called chair-shaped pulse. Further, some tailored pulses may have multiple spikes or multiple plateaus that are not described by the peak power P1. For example, as shown in FIG. 11B, a peak power P1 of a spike does not describe the height of a first plateau power P2 or a second plateau power P3. In addition, as discussed below, a pulse width based on a FWHM metric may provide the same result for a plurality of chair-shaped pulses with different "seat" lengths.

In one embodiment, a laser processing system is configured to select a first temporal pulse profile for a first type of structure on a workpiece and a second temporal pulse profile for a second type of structure on the workpiece. A temporal pulse profile used for processing a particular integrated circuit feature, such as a link on a semiconductor memory device, may be inefficient or ineffective for performing a separate laser processing operation on the same device. Thus, the laser processing system provides on-the-fly selection of appropriate temporal pulse profiles based on the type of target structure being processed.

Figure 12:
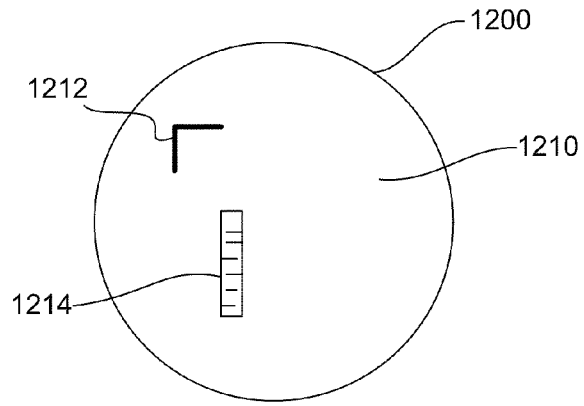
FIG. 12 is a schematic diagram illustrating a semiconductor wafer having on its work surface a target alignment feature and electrically conductive link structures according to one embodiment.

For example, FIG. 12 is a schematic diagram illustrating a semiconductor wafer 1200 having on its work surface 1210 a target alignment feature 1212 and electrically conductive link structures 1214 according to one embodiment. A shaped laser pulse with a high pulse energy and a high peak power resulting from a leading edge spike (e.g., see FIG. 11A) may be useful for selectively blowing one or more of the link structures 1214. However, the high pulse energy and/or high peak power may cause damage to the target alignment feature 1212 during alignment scans, which may then result in erroneous position information derived from such scans. Thus, the laser processing system may be operated in a first temporal pulse profile mode that produces pulses with relatively lower pulse energy and peak power for target scans, and a second temporal pulse profile mode that produces pulses with relatively higher pulse energy and peak power for blowing the link structures 1214.

As those skilled in the art will appreciate, a wide range of peak powers, pulse energies, and temporal profiles may be attractive for laser processing of structures on a workpiece. A tailored pulse shape may be employed, for example, to sever electrically conductive link structures in a wide array of semiconductor memory devices, including DRAM, SRAM, and flash memory; to produce laser drilled micro-vias in flexible circuits, such as copper/polyamide layered materials, and in integrated circuit (IC) packages; to accomplish laser processing or micromachining of semiconductors, such as laser scribing or dicing of semiconductor integrated circuits, silicon wafers, and solar cells; and to accomplish laser micromachining of metals, dielectrics, polymeric materials, and plastics. One skilled in the art will recognize that many other types of workpieces and/or workpiece structures may be processed according to the embodiments disclosed herein.

Figure 13:
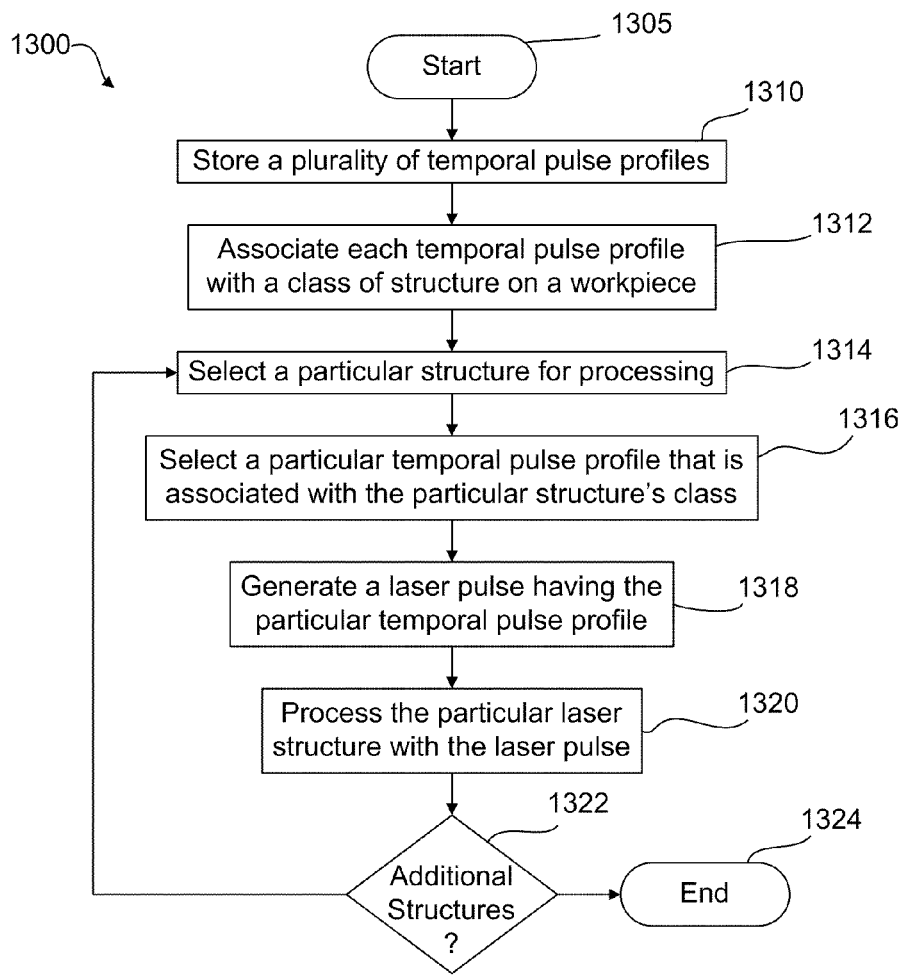
FIG. 13 is a flow chart of a method for laser processing of structures on or in a workpiece according to one embodiment.

Thus, in one embodiment, the laser processing system allows a user to program a temporal pulse profile for processing a specific type or class of structures. For example, FIG. 13 is a flow chart of a method 1300 for laser processing of structures on or in a workpiece according to one embodiment. After starting 1305, the method 1300 includes storing 1310 a plurality of user-defined temporal pulse profiles, and associating 1312 each of the temporal pulse profiles with a type or class of structure on a workpiece or group of workpieces. The class of structures may include, for example, alignment structures, electrically conductive links, and resistors or other discrete components. In some embodiments, the class may also include, for example, a scribe line or kerf cut into the workpiece with the laser.

When processing workpieces, the method 1300 includes selecting 1314 a particular structure on or within a workpiece for processing, and selecting 1316 a particular temporal pulse profile from the plurality of temporal pulse profiles that is associated with the particular structure's class. The method 1300 also includes generating 1318 a laser pulse having the particular temporal pulse profile, and processing 1320 the particular structure with the generated laser pulse. An artisan will recognize from the disclosure herein that instead of using a single pulse to process the particular structure, the laser processing system may direct multiple pulses to the particular structure. Further, each of the pulses directed to the particular structure may have the same temporal pulse profile, or at least one of the pulses may have a different temporal pulse profile.

The method 1300 then queries 1322 whether the workpiece includes additional structures to process. If there are additional structures to process, the method 1300 then selects 1314 another particular structure for processing. Thus, the method 1300 provides on-the-fly processing of structures using a plurality of different temporal pulse profiles based on the type of structure. If there are no additional structures to process, the method 1300 ends 1324.

III. Example Laser Processing System

Figure 14:
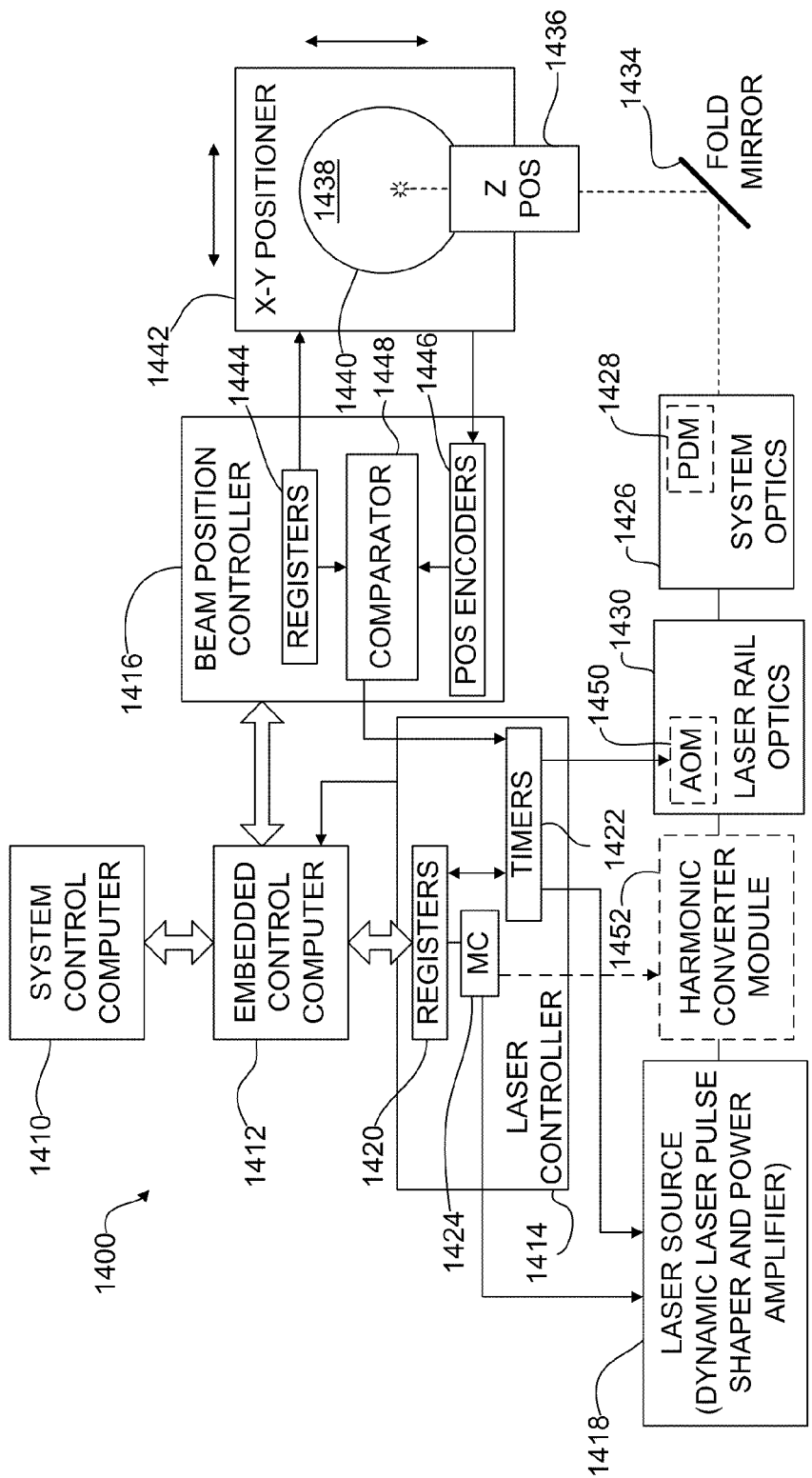
FIG. 14 is an example laser processing system for generating and monitoring laser pulses with different temporal pulse profiles according to one embodiment.

FIG. 14 is an example laser processing system 1400 for generating and monitoring laser pulses with different temporal pulse profiles according to one embodiment. The system 1400 includes a system control computer 1410 to provide an embedded control computer (ECC) 1412 overall system operational commands to which a laser controller 1414 and a beam position controller (BPC) 1416 respond. The system 1400 also includes a laser source 1418 that is controlled by the laser controller 1414, which includes command and data registers 1420 and timers 1422 that directly or indirectly communicate with the ECC 1412 and the BPC 1416. As discussed in detail below, in one embodiment, the laser source 1418 includes a dynamic laser pulse shaper and fiber power amplifier. In another embodiment, the laser source 1418 includes a tandem amplifier. In yet another embodiment, the laser source 1418 includes "sliced" pulse laser that uses an electro-optical modulator (see the description herein related to FIGS. 27 and 28).

The laser controller 1414 receives commands from the ECC 1412 and signals from the BPC 1416. The laser controller 1414 provides commands to the laser source 1418 for pulse emission (through external trigger commands) and pulse shape control. In one embodiment, the laser controller 1414 receives commands from the ECC 1412, and responds to the commands by issuing external trigger commands to the laser source 1418 from a modulator controller (MC) 1424 in coordination with the BPC 1416 based on workpiece feature position data. The MC 1424 controls the times of emission and shapes of pulses emitted by laser source 1418. Alternatively, the laser source 1418 emits pulses with an interpulse time that is communicated to the laser controller 1414, the ECC 1412, or both. In one embodiment, depending on the type of workpiece feature on which the emitted laser pulse will be incident, the laser source 1418 is commanded by the ECC 1412 to produce a specific temporal pulse profile. Illustrative examples of such temporal profiles are shown in FIGS. 11A and 11B.

To provide programmable temporal pulse profiles, according to one embodiment, the system 1400 provides instrumentation for satisfactory measurement and calibration of a range of pertinent laser process parameters, such as temporal profile, energy per pulse, focused beam propagation attributes, and other parameters discussed below. As shown in FIG. 14, system optics 1426 may include a photodetection module 1428, which may be employed for the detection of incident laser output and of laser output reflected from the work surface. In one embodiment, the photodetection module 1428 includes a photodetector circuit capable of fine digitization of the detected light signals, such as the incident and reflected laser output signals, thereby allowing for the incident and reflected pulse waveforms to be effectively digitized. Thus, the system 1400 allows for satisfactory measurement of the incident and reflected laser waveforms, allowing calculation and calibration of the temporal profile, temporal profile variation, pulse amplitude stability, pulse energy stability, and the energy per pulse. As those skilled in the art will recognize, scanning the laser beam across a target area of sharply varying reflectivity at the laser wavelength provides a method for measurement and calculation of the focused spot size attributes of the laser beam.

Figure 15:
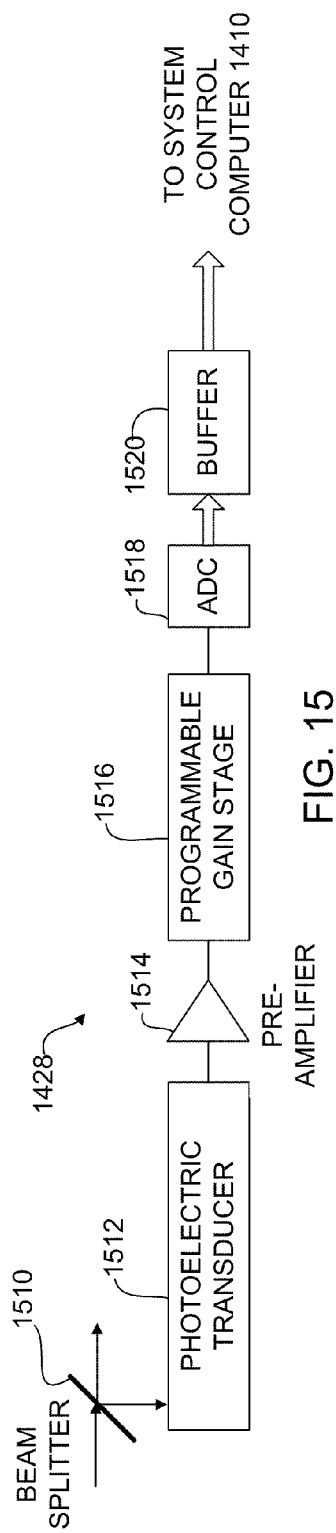
FIG. 15 is a block diagram of an example photodetection module according to one embodiment.

FIG. 15 is a block diagram of an example photodetection module 1428 according to one embodiment. The photodetection module 1428 includes an optical beam splitter 1510 to split off a portion of the output from laser rail optics 1430 shown in FIG. 14 onto a photoelectric transducer 1512 connected to a signal conditioning pre-amplifier 1514. The pre-amplifier 1514 is connected to a programmable gain stage 1516, which feeds into a high-speed analog-to-digital converter (ADC) 1518. The digitized output of the ADC 1518 is buffered by a circular buffer 1520 for later transfer to the system control computer 1410 shown in FIG. 14.

The photoelectric transducer 1512 may be chosen for sensitivity to a particular laser wavelength, for a temporal response characteristic that is consistent with the temporal profile of the shaped laser pulses, and/or for a dynamic range consistent with the anticipated range of intensities of optical radiation to which it will be exposed. The programmable gain stage 1516 serves to compensate for the variable optical attenuation implemented in the laser rail optics 1430 if the attenuation is implemented prior to the point where the beam is sampled by the photoelectric transducer 1512. Attenuating the beam to reduce power at the work surface would also reduce the amount of power incident on the photoelectric transducer 1512. The programmable gain stage 1516 electrically restores the signal level to maximize the resolution of the signal as sampled by the ADC 1518.

The ADC 1518 may be chosen for a sample rate and slew rate sufficiently high so as to resolve the anticipated pulse profiles. A flash converter architecture may be used, but because the function may be continuously sampling data, pipelining and/or successive approximation technologies are also suitable and may provide better performance metrics. The conversion width of the ADC (e.g., 8-bit, 12-bit, 16-bit or more) may be chosen based on the desired resolution and dynamic range capabilities of the system 1400.

The digitized samples of the detected signal are continuously transferred into the circular buffer 1520. The buffer 1520 may be sufficiently sized so as to store the entire pulse from start to finish with at least enough excess capacity to account for latency in analysis of the data by pulse detection logic. In real time, a pulse detector logic function analyzes the digitized pulse waveform to detect the presence of a pulse in the buffer 1520. When the pulse is detected and determined to be complete, this function stops the action of continuing to update the buffer 1520 and holds the buffer 1520 for later upload to the system control computer 1410. The digitization and storage function may later be "re-armed" by a subsequent command from the system control computer 1410. The pulse detector logic function may be implemented using a digital signal processor (DSP), a field programmable gate array (FPGA), or other computational engine. An FPGA implementation may include both DSP and buffer memory elements in a single device.

Once a complete pulse has been stored in the circular buffer 1520, it can be uploaded to the system control computer 1410 for analysis. Analysis may include, for example, determination of peak height, determination of pulse energy by integrating the profile of the pulse, determination of pulse width, and characterization of pulse profile as discussed in detail below.

In addition, or in another embodiment, the DSP, FPGA, or other computation engine might also implement a combination of the pulse characterization metric computations. In such an embodiment, the system 1400 may choose not to upload the raw digitized pulse data to the system control computer 1410, but instead only upload some subset of the pulse characterization metrics. An advantage of this embodiment is to reduce bandwidth requirements of the connection between the photodetection module 1428 and the system control computer 1410, which allows more measurements to be made faster while maintaining a relatively simple electrical interface.

Returning to FIG. 14, in one embodiment of the laser processing system 1400, the output from the laser source 1418 is applied to the laser rail optics 1430 and the system optics 1426. Output from the system optics 1426 is directed by a fold mirror 1434 toward a Z-positioning mechanism 1436, which may incorporate a lens assembly, for subsequent delivery to a work surface 1438 of a target specimen 1440 for laser processing of workpiece features (e.g., the target alignment feature 1212 and the link structures 1214 shown in FIG. 12). The BPC 1416 provides X-Y coordinate positioning signals to direct an X-Y positioning mechanism 1442 to a location where the output from the Z-positioning mechanism 1436 can process a desired target feature. The X-Y positioning mechanism 1442 receives command position signals from registers 1444 of the BCP 1416 and directs actual position signals to position encoders 1446 of the BCP 1416, which includes a comparator module 1448 that determines a position difference value and sends it to the timers 1422. The timers 1422 respond by sending a trigger signal appropriately timed to operate in the laser rail optics 1430 an acousto-optic modulator (AOM) 1450 that modulates the output from the laser source 1418. Those skilled in the art will recognize that the pulse output from laser source 1418 may be directed into a harmonic conversion module 1452 and subsequently delivered by way of the laser rail optics 1430 and the system optics 1426 to the work surface 1438 for harmonic laser processing of workpiece features.

Those skilled in the art will recognize that alternative arrangements of laser processing system elements may be employed and a wide variety of workpieces may be processed by the laser processing system 1400.

Figure 16A:
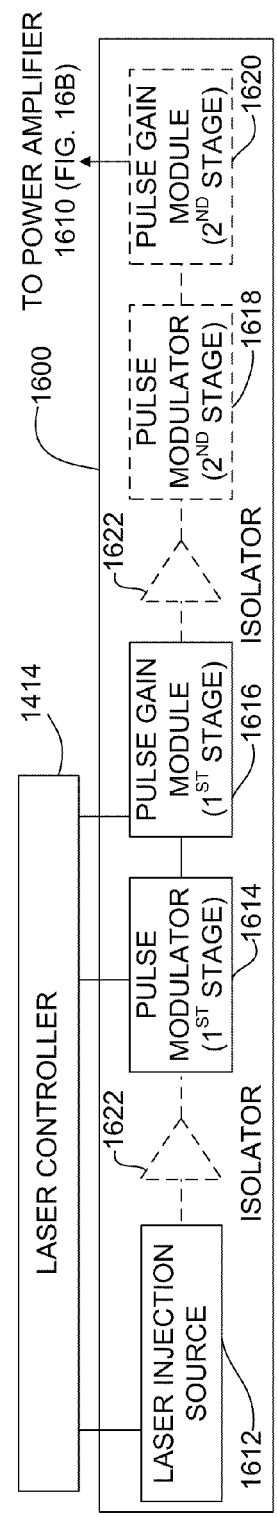
FIGS. 16A and 16B are block diagrams illustrating the laser source shown in FIG. 14 according to one embodiment.
Figure 16B:
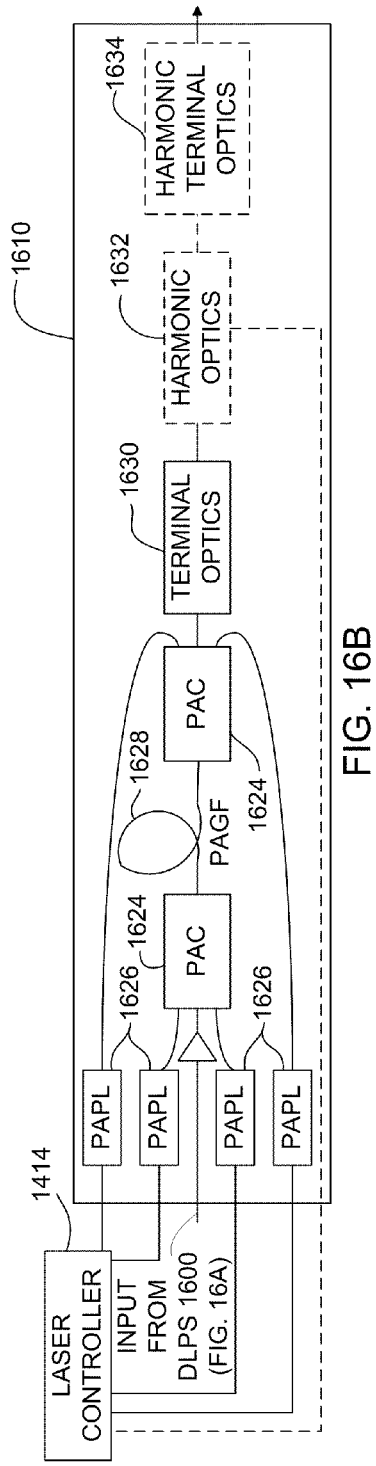

FIGS. 16A and 16B are block diagrams illustrating the laser source 1418 shown in FIG. 14 according to one embodiment. A similar laser source is described in detail in U.S. Patent Application Pub. No. 2006-0159138, titled "Pulsed Laser Light Source," by Deladurantaye et al. FIG. 16A illustrates a dynamic laser pulse shaper (DLPS) 1600, and FIG. 16B illustrates a fiber power amplifier (FPA) 1610. As shown in FIG. 16A, the DLPS 1600 includes a laser injection source 1612, a first pulse modulator 1614, and a first pulse gain module 1616. In some embodiments, the DLPS 1600 also includes a second pulse modulator 1618 and a second pulse gain module 1620. The DLPS 1600 may also include one or more isolators 1622 (two shown) between elements. As those skilled in the art will appreciate, several alternative arrangements of the modulator and gain elements may be advantageously employed.

The laser injection source 1612 emits a continuous wave (CW) output that is then modulated by the first pulse modulator 1614 to produce a suitable first laser pulse profile as commanded by the laser controller 1414. In another embodiment, the laser injection source 1612 may produce a pulsed output. The first pulse modulator 1614 may be an electro-optic modulator, an acousto-optic modulator, or other optical modulator. The laser pulse produced by the first pulse modulator 1614 is then transformed by the first pulse gain module 1616 to produce a transformed temporal pulse output that is suitable for amplification and subsequent delivery through the laser rail optics 1430 and system optics 1426 to the work surface 1438 for laser processing of workpiece features.

The laser controller 1414 may be programmed with a matrix of command signals for input to the first pulse modulator 1614 to produce a range of laser pulse profiles that, when subsequently input to the first pulse gain module 1616, result in the production of transformed laser pulse profiles desired as output from the DLPS 1600. Accordingly, the system control computer 1410 may then select the temporal pulse profile output from the DLPS 1600 as a function of a workpiece feature to be processed through commands issued to the ECC 1412, which in turn issues commands to the laser controller 1414. As shown in FIG. 16A, the DLPS 1600 may, in some embodiments, include the second pulse modulator 1618 and the second pulse gain module 1620 to provide additional or more complex shaping of the temporal pulse profile output from the DLPS 1600.

In one embodiment, the transformed pulse output from the DLPS 1600 is injected into the FPA 1610 shown in FIG. 16B. The FPA 1610 includes power amplifier couplers (PACs) 1624 (two shown) that allow injection of the DLPS's output and output from power amplifier pump lasers (PAPLs) 1626 (four shown) into a power amplifier gain fiber (PAGF) 1628. The laser controller 1414 is connected to the PAPLs 1626 and may, for example, control the PAPLs' current (e.g., through a diode laser or a semiconductor laser), control the PAPLs' temperature (e.g., through a thermo-electrical cooler), and/or monitor the PAPLs' power (e.g., through a photodiode). The PACs 1624 may be placed at either or both ends of the fiber. Multiple additional PACs may be spliced into the length of the PAGF 1628. The PAGF 1628 is preferably a large mode area (LMA) polarization maintaining fiber. The PAGF 1628 may include frequency selecting structures. The PAGF 1628 in one embodiment is a waveguide device with a silica fiber core doped with rare earth ions and clad with one or more concentric sheaths of optical material. The PAGF 1628 in another embodiment includes concentric cladding sheaths that have regions doped with rare earth ions. The PAGF 1628 in yet another embodiment is a photonic crystal fiber in which the cladding sheath or sheaths include a highly periodic distribution of air holes. In another embodiment, the PAGF 1628 is a single-mode polarization maintaining fiber. Those skilled in the art will recognize that the number of PAPLs 1626 used is determined by the type and length of the PAGF 1628 and the desired optical pulse output characteristics from the FPA 1610. The output from the PAGF 1628 may be collimated and polarized, as may be required by terminal optics 1630.

In one embodiment, output pulses from the FPA 1610 are provided through the terminal optics 1630, harmonic optics module 1632, and optional harmonic terminal optics 1634. The harmonic optics module 1632 includes nonlinear crystals for the conversion of the incident output pulse to a higher harmonic frequency through the well-known method of harmonic conversion. In an example embodiment, for harmonic conversion of 1064 nm output from the FPA 1610 to 355 nm, the harmonic optics module 1632 includes Type I non-critically phase-matched lithium triborate (LBO) crystal for second harmonic generation (SHG) conversion followed by a Type II, sum frequency generation LBO crystal cut for 1064 nm plus 532 nm to 355 nm harmonic conversion. In another example embodiment, for conversion to 266 nm, the THG LBO crystal may be replaced by a critically phase-matched Beta-Barium Borate (BBO) crystal. In yet another example embodiment, for fourth harmonic generation (FHG) conversion to 266 nm, cesium lithium borate (CLBO) may be used. One skilled in the art will recognize from the disclosure herein that the harmonic optics module 1632 may also include focusing lens elements. The elements in the harmonic optics module 1630 may be placed into temperature controlled mounts that has a temperature set and controlled by the laser controller 1414 using active and/or passive feedback loops so as to precisely control phase-matching temperatures.

IV. Pulse Shape Feedback and Control

As discussed above, tailored pulse profiles are generally not adequately described by peak power, pulse energy, and pulse width metrics. Thus, certain embodiments described in detail below provide pulse shape feedback (e.g., sensing) and control. The embodiments include specific types of feedback and example feedback methods. Pulse shape control and control algorithms are also described.

When processing workpieces with tailored laser pulses, it may be desirable to reproduce pulse shapes from one link processing system to another, to maintain pulse shapes over time, and to provide pulse-shape related statistical feedback suitable for correlating with process trends. Thus, in one embodiment, a laser processing system provides pulse-shape feedback that goes beyond the typical peak height, pulse energy, and pulse-width solution generally used for solid state lasers. In one embodiment, the laser processing system includes an inline pulse profiler that is configured to monitor the pulse shape at runtime. Data collected by the pulse profiler are processed through a set of predetermined algorithms to compute metrics on the pulse shape and/or deviation from a nominal pulse shape. The data and statistical results are available for creating and maintaining reproducible pulse shapes and statistical analysis of pulse shapes. The data and statistical results may also be available for pulse shape control, as described below.

A. Feedback Metrics

The following example metrics may be used to specify and analyze temporal pulse profiles. Temporal pulse profiles may be defined as a combination of several parameters corresponding to pulse features such as spikes, plateaus, and slopes. For example, a chair-shaped pulse includes an initial peak or spike followed by a plateau. An artisan will recognize from the disclosure herein that additional features may also be defined.

While it may be desirable to specify all aspects of the pulse shape, a limited set of parameters are controlled in certain embodiments to generate tailored pulses. For example, in one embodiment, there are about twelve variables that may be adjusted to generate pulse shapes, and several of these parameters may not be used when specifying shorter pulses. The number of controlled parameters may depend on the laser's ability to response to the parameters.

In one embodiment, temporal pulse profiles are defined by general parameters such as rise time and pulse duration. These parameters fall into two different categories consisting of overall pulse parameters and feature defining parameters. Overall pulse parameters are metrics that apply to the whole pulse shape such as rise time, total pulse duration, and overall peak time. Feature defining parameters are metrics that apply to portions of the pulse shape such as the time, height, and width of peaks or the start, stop, and height of plateaus.

1. Overall Pulse Parameters

The following example feedback metrics apply to an overall pulse shape.

(i) Peak Pulse Power

Figure 17:
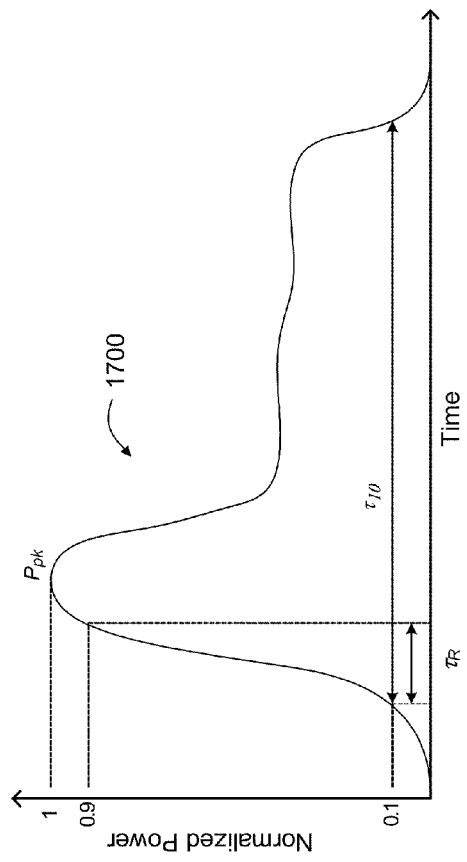
FIG. 17 graphically illustrates a normalized tailored laser pulse characterized, at least in part, by a peak pulse power according to one embodiment.

FIG. 17 graphically illustrates a normalized tailored laser pulse 1700 characterized, at least in part, by a peak pulse power $P_{pk}$ according to one embodiment. Pulse shapes may be normalized relative to a peak pulse power to ease amplitude specifications for peaks and plateaus. The peak pulse power $P_{pk}$ is defined as the maximum power any time during the pulse. The peak pulse power may be specified with a tolerance for analysis of multiple pulses with the same normalization scaling.

(ii) Pulse Start Time

Generally, feedback metrics are defined such that they may be measured. However, there is often some ambiguity as to the exact moment that a measured pulse commences. Thus, the timing of specific pulse features may be specified relative to a pulse start time that does not have a precisely identifiable time value. For the purpose of measurement and verification, the pulse start time $T_{start}$, which is used to define the timing of pulse features, has no absolute definition. When comparing specifications and measured shapes according to certain embodiments, the start time may be advanced or retarded in order to make the measured shape features best comply with pulse feature specifications.

(iii) Pulse Rise Time

As shown in FIG. 17, a pulse rise time $\tau_R$ according to one embodiment is defined as the time interval to transition from approximately 10% to approximately 90% of the difference between a lower level and an upper level of the normalized power profile. In certain embodiments, the lower level corresponds to zero pulse energy and the upper level corresponds to the height of an initial spike that includes the highest power level of the pulse 1700.

(iv) 10% Pulse Duration

As shown in FIG. 17, a 10% pulse duration $\tau_{10}$ according to one embodiment is defined as the maximum time interval between the first and the last point in time that attains 1/10 of the peak pulse power. This definition allows a pulse to drop below 10% of the peak power without defining additional 10% pulse duration sections. This definition is used because peaks and plateaus generally include temporal power variations that may drop below 10%. An artisan will recognize from the disclosure herein that other percentages may also be used depending on the particular application.

(v) Time Integral Squared Pulse Duration

A single tailored pulse may be measured using an oscilloscope with a suitable photodetector. One way to describe the resulting power versus time curve is by the peak height and FWHM values. As discussed above, however, FWHM is not an effective method to compare pulses with significantly different temporal profiles, such as those generated by tailored pulse technology. Rather, what is needed is a way to describe the pulse width of a peak in relation to the resulting effects that will be observed in the material that is to be processed.

FIGS. 18A and 18B illustrate a problem stemming from using peak power and FWHM to characterize tailored laser pulses. FIGS. 18A and 18B each illustrates multiple different temporal pulse shapes generated by, for example, a fiber laser or MOFPA according to certain embodiments (four temporal pulse shapes are shown in FIG. 18A and three temporal pulse shapes are shown in FIG. 18B). Although the peak heights and FWHM values of the four pulses in FIG. 18A are identical, these four pulse shapes yield significantly different results when used for laser processing of electrically conductive links.

FIG. 18B provides another example for shaped pulses with different length "chairs." When the chair height is below the half-maximum value, a significant amount of pulse energy may be added to the pulse (e.g., the length of the "chair" portion of the pulse may be extended out indefinitely) without any change in the FWHM value.

Another accepted industry standard characterization of pulse width, the time integral squared ($T_{IS}$) method, overcomes the limitations of the FWHM method. Thus, in certain embodiments, the feedback metric for tailored pulses includes determining a $T_{IS}$ pulse duration or width, instead of using the common FWHM method. The following equation defines the $T_{IS}$ pulse width:

$$T_{IS} = \frac{\left(\int I(t)dt\right)^2}{\int I^2(t)dt},$$

where I(t) is the pulse curve in power versus time.

The $T_{IS}$ method has been used with 193 nm lithography systems. Pulse shapes of excimer lasers used for 193 nm lithography are oscillatory and may be described as several overlapping peaks that vary in relative intensity over the operating condition of the laser. Because damage to fused silica is a concern at 193 nm, a relevant method was sought to correlate the unusual shape of the 193 nm pulses to the anticipated damage to the silica. The $T_{IS}$ was proven to be effective for predicting compaction of fused silica and is an accepted standard in 193 nm lithography applications.

The $T_{IS}$ value correlates well with other pulse parameters such as energy density, pulse length, and peak power. The $T_{IS}$ method is useful because it captures the relevant characteristics of the pulse much better than does FWHM and allows correlation to the established damage models for fused silica.

Figure 19:
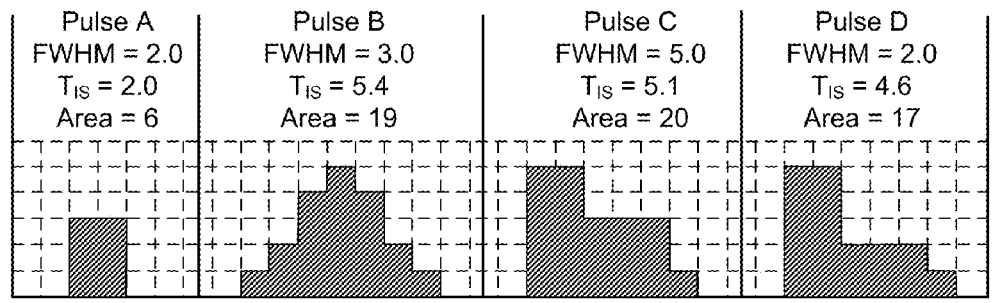
FIG. 19 illustrates four simplified pulse shapes (pulses A-D) and corresponding comparisons between FWHM and $T_{IS}$ pulse width values according to one embodiment.

FIG. 19 illustrates four simplified pulse shapes (pulses A-D) and corresponding comparisons between FWHM and $T_{IS}$ pulse width values. Pulse A shows that for any square pulse, the $T_{IS}$ value is approximately equal to the FWHM value. Pulse B shows that for more Gaussian-like shapes, the $T_{IS}$ is larger than the FWHM value (in this case, the FWHM value is 3.0 units while the resulting $T_{IS}$ pulse width is 5.4 units). Pulses C and D show simplified versions of chair-shaped tailored pulse with the chair height adjusted above and below the half-max power, respectively. For Peak C, the FWHM value and the $T_{IS}$ value are both approximately 5.0 units. Dropping the height of the chair power for Peak D provides a FWHM value of 2.0 units and a $T_{IS}$ value of 4.6 units, suggesting that $T_{IS}$ is a more effective method to capture the materials processing ability of the pulse.

Figure 20:
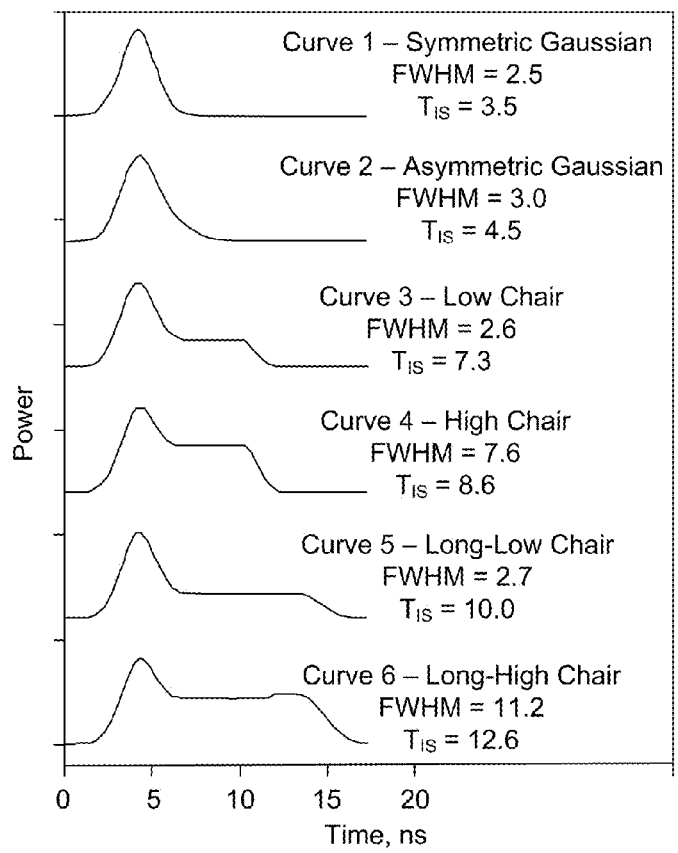
FIG. 20 illustrates six laser pulse shapes (curves 1-6) and corresponding comparisons between FWHM and $T_{IS}$ pulse width values according to one embodiment.

FIG. 20 illustrates six laser pulse shapes (curves 1-6) and corresponding comparisons between FWHM and $T_{IS}$ pulse width values. Curve 1 is a Gaussian shaped pulse with a FWHM value (2.5 ns) that is less than the $T_{IS}$ value (3.5 ns). Curve 2 shows that introducing a slight asymmetry into the pulse trailing edge yields a slightly larger value for $T_{IS}$ (4.5 ns) over that of FWHM (3.0 ns). Curves 3 through 6 are examples of the chair-shaped tailored pulse and demonstrate the advantage of using the $T_{IS}$ method over the FWHM method. This advantage is very apparent when the power of the chair height falls below the half-maximum. Comparing curves 3 and 4 shows that the FWHM value changes from 2.6 ns to 7.5 ns, while the $T_{IS}$ method provides a more reasonable value comparison of 7.3 ns to 8.6 ns, respectively. The same trend is observed for curves 5 and 6. Comparison of curves 3, 4, 5 and 6 also reveals that the $T_{IS}$ pulse width has a more reasonable trend that follows the actual pulse area and more closely relates to the results for laser-materials processing. Thus, in one embodiment, the feedback metric includes determining the $T_{IS}$ value of the generated pulse shape.

(vi) Comparison to a Stored Pulse Shape

In one embodiment, the feedback metric includes a determination of the standard deviation of the generated pulse shape from a stored nominal pulse shape.

(vii) Comparison to a Time Derivative of a Stored Pulse Shape

In another embodiment, the feedback metric includes a determination of the standard deviation of the time derivative of the generated pulse shape from the time derivative of the nominal pulse shape. A comparison of the time derivatives is useful, for example, for analyzing whether the measured pulse shape has a desired rise time. Other statistical metrics that may be used include, but are not limited to, using a root-mean-square (RMS), or an integral of an absolute error.

2. Feature Defining Parameters

The following example feedback metrics apply to specific portions or features of a pulse. In one embodiment, pulses are defined as a combination of characterized spikes, plateaus, and slopes.

(i) Spike Characterization

Figure 21:
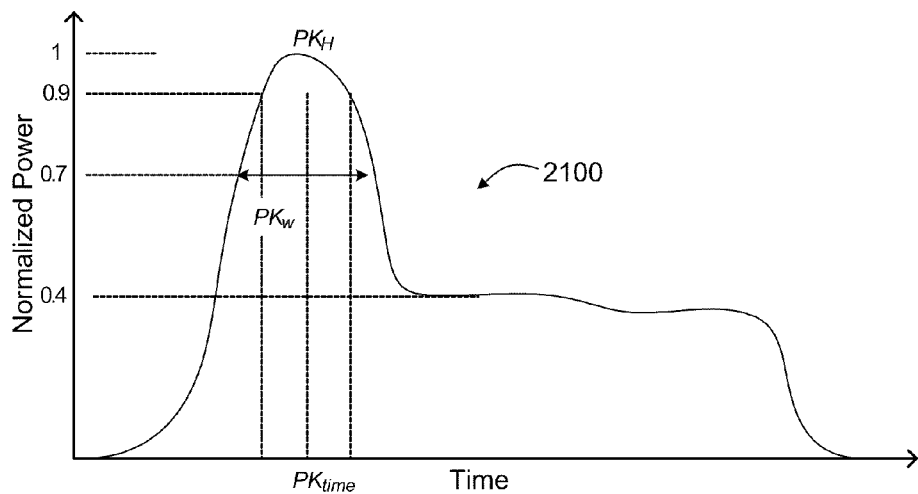
FIG. 21 graphically illustrates a normalized tailored laser pulse having a spike characterized by a peak height, a peak width, and a peak time according to one embodiment.

FIG. 21 graphically illustrates a normalized tailored laser pulse 2100 having a spike characterized by a peak height $PK_H$, a peak width $PK_W$, and a peak time $PK_{time}$ according to one embodiment. The peak height $PK_H$ is defined as the maximum power attained during a time interval containing the spike and no other features (e.g., no other spikes or plateaus). Because a pulse may include multiple spikes, a particular peak height $PK_H$ may differ from the overall pulse height or peak pulse power $P_{pk}$ discussed above in relation to FIG. 17.

The peak width $PK_W$ is defined as the width of the spike from the first time to the last time the spike obtains an amplitude that is mid-way between the peak height $PK_H$ and the amplitude of the highest feature (e.g., plateau) that precedes or succeeds the spike. The peak time $PK_{time}$ is the average of the first and last times that the peak power achieves 90% of the maximum value for that spike. Because it is an average of two times, the peak time $PK_{time}$ does not necessarily occur at the instant that the spike achieves its maximum power.

(ii) Plateau Characterization

Figure 22:
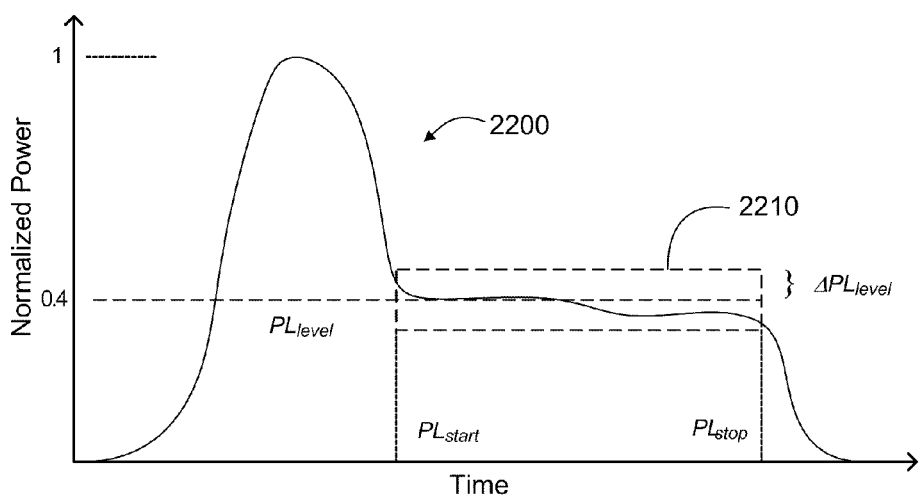
FIG. 22 graphically illustrates a normalized tailored laser pulse having a plateau characterized by a start time, a stop time, and a level associated with a tolerance according to one embodiment.

FIG. 22 graphically illustrates a normalized tailored laser pulse 2200 having a plateau characterized by a start time $PL_{start}$, a stop time $PL_{stop}$, and a level $PL_{level}$ associated with a tolerance $\Delta PL_{level}$ according to one embodiment. The start time $PL_{start}$ and stop time $PL_{stop}$ specify, respectively, the start and stop of the plateau relative to the pulse start time. The start time $PL_{start}$ and stop time $PL_{stop}$ parameters may be specified without tolerances. The plateau level $PL_{level}$ is the expected amplitude. Between the start time $PL_{start}$ and the stop time $PL_{stop}$, the amplitude remains inside of a box 2210 (shown with dashed lines) that is within a specified tolerance $+/-\Delta PL_{level}$ of the plateau.

(iii) Slope Characterization

Figure 23:
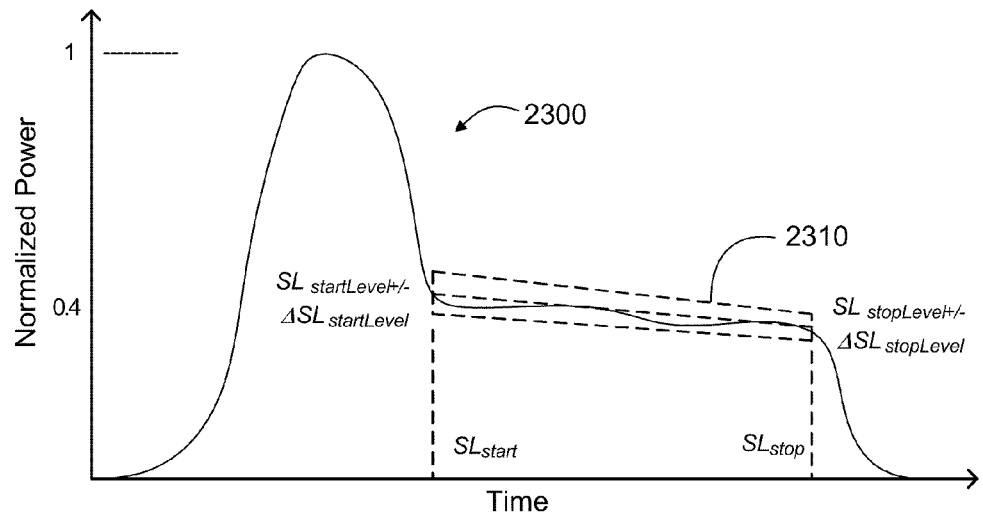
FIG. 23 graphically illustrates a normalized tailored laser pulse having a sloped or tilted plateau characterized by a start time, a stop time, a starting level associated with first a tolerance, and a stopping level associated with a second tolerance according to one embodiment.

FIG. 23 graphically illustrates a normalized tailored laser pulse 2300 having a sloped or tilted plateau characterized by a start time $SL_{start}$, a stop time $SL_{stop}$, a starting level $SL_{startLevel}$ associated with a tolerance $\Delta SL_{startLevel}$, and a stopping level $SL_{stopLevel}$ associated with a tolerance $\Delta SL_{stopLevel}$ according to one embodiment.

The start time $SL_{start}$ and stop time $SL_{stop}$ specify the start and stop of the plateau relative to the pulse start time. These parameters may be specified without tolerances. The start level $SL_{startLevel}+/-\Delta SL_{startLevel}$ is the expected starting amplitude and the stop level $SL_{stopLevel}+/-\Delta SL_{stopLevel}$ is the expected final amplitude. Between the start time $SL_{start}$ and the stop time $SL_{stop}$, the amplitude remains inside of a box 2310 (e.g., trapezoid shown with dashed lines) with end points identified by the starting and finishing level and tolerances.

(iv) Peak Power by Pulse Section

In one embodiment, the feedback metric includes measuring the peak height (power) of various sections of the generated pulse shape. For example, the peaks (e.g., maximum power levels) of the "back" and the "seat" of a chair-shaped pulse may be measured separately and compared to predetermined values for each. As another example, the power of each spike in a multi-spiked pulse may be measured separately and compared to predetermined values for each.

(v) Energy by Pulse Section

In one embodiment, the feedback metric includes measuring the energy of various sections of the generated pulse shape. For example, the energy of the "back" and the "seat" of a chair-shaped pulse may be measured separately and compared to predetermined values for each. As another example, the energy of each spike in a multi-spiked pulse may be measured separately and compared to predetermined values for each.

(vi) Characterization by Binned Shape Information

In one embodiment, the feedback metric includes determining binned shape information. For example, the laser system may have control over twelve time bins that are each approximately 2.5 ns wide. In such embodiments, the feedback includes shape information (e.g., power and energy) that corresponds to the same twelve bins for ease of adjustment.

3. Example Pulse Shape Characterization

Figure 24A:
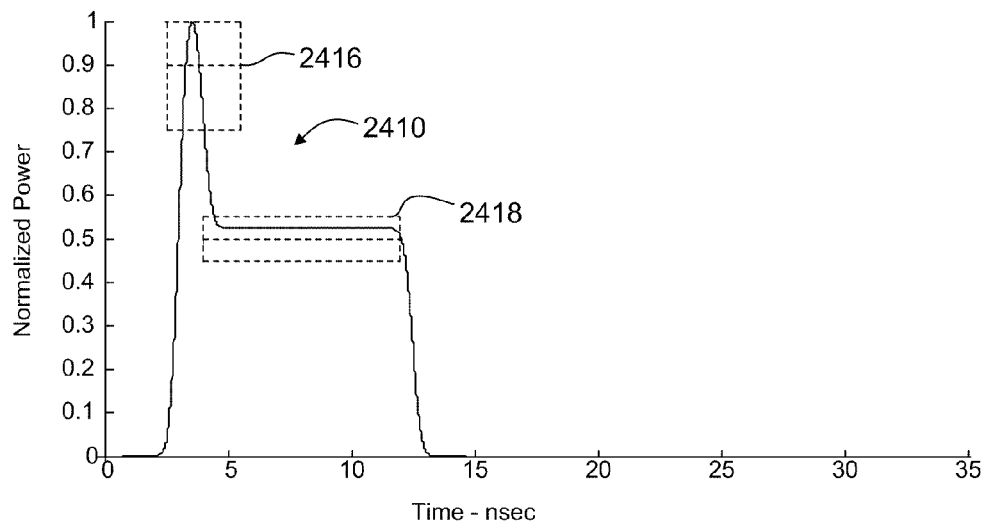
FIGS. 24A, 24B and 24C graphically illustrate example tailored laser pulses having various peaks, plateaus and slopes characterized by the parameters described herein according to certain embodiments.
Figure 24B:
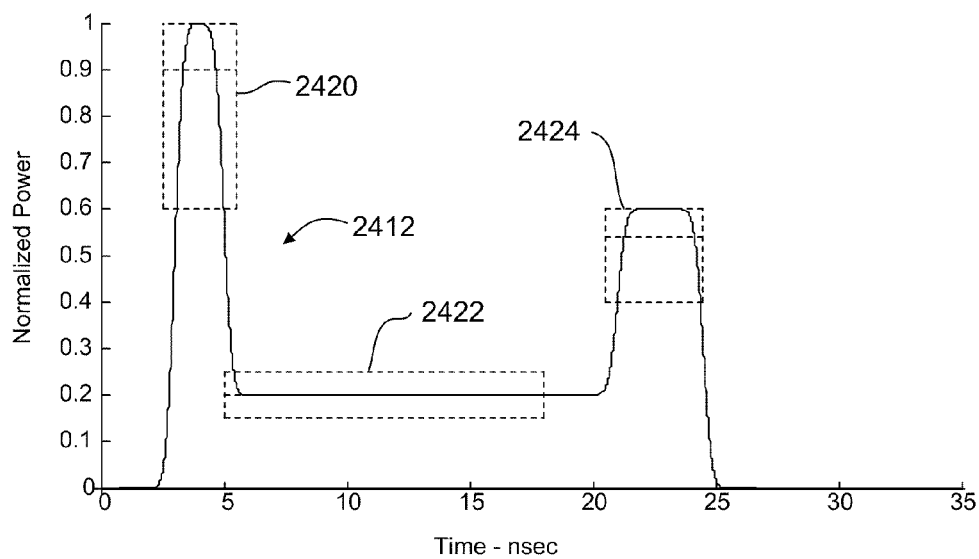
Figure 24C:
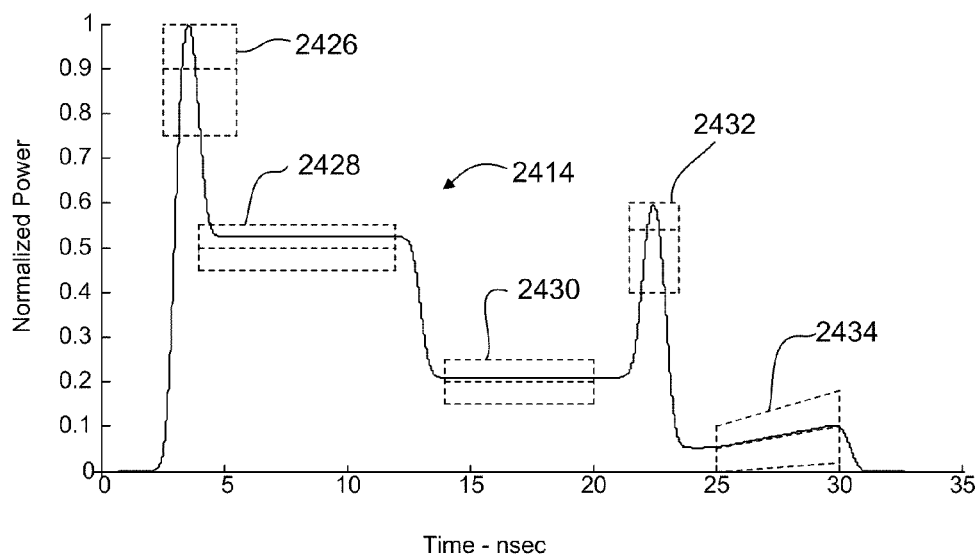

FIGS. 24A, 24B and 24C graphically illustrate example tailored pulses 2410, 2412, 2414 having various spikes, plateaus and slopes characterized by the parameters described herein according to certain embodiments. In FIG. 24A, a spike is defined as being within a set of parameters/tolerances represented by a first box 2416 and a plateau is defined as being within a set of parameters/tolerances represented by a second box 2418. Similarly, in FIG. 24B, a first spike is defined as being within a set of parameters/tolerances represented by a first box 2420, a plateau is defined as being within a set of parameters/tolerances represented by a second box 2422, and a second spike is defined as being within a set of parameters/tolerances defined by a third box 2424.

In FIG. 24C, a first spike is defined as being within a set of parameters/tolerances represented by a first box 2426, a first plateau is defined as being within a set of parameters/tolerances represented by a second box 2428, a second plateau is defined as being within a set of parameters/tolerances represented by a third box 2430, a second spike is defined as being within a set of parameters/tolerances defined by a fourth box 2432, and a sloping plateau is defined as being within a set of parameters/tolerances defined by a fifth box (e.g., trapezoid) 2434. An artisan will understand from the disclosure herein that the pulses illustrated in FIGS. 24A, 24B and 24C are provided by way of example only and that methods described herein for characterizing pulses may be applied to pulses of any shape or having any number of spikes, plateaus and/or slopes.

Table 2 provides an example set of parameters that define a chair-shaped pulse according to one embodiment. An artisan will understand from the disclosure herein that the values listed in Table 2 for the various parameters are provided by way of example only, and not by limitation.

TABLE 2

| Parameter | Specified Value | Tolerance (+/−) | Units |
|---|---|---|---|
| Peak Time | 4 | 1 | nsec |
| Peak Width | 3.5 | 1 | nsec |

TABLE 2-continued

| Parameter | Specified Value | Tolerance (+/−) | Units |
|---|---|---|---|
| Peak Height | 1 | 0.05 | normalized power |
| Plateau Start | 7 | — | nsec |
| Plateau Stop | W−1 | — | nsec |
| Plateau Height | 0.6 | 0.05 | normalized power |
| Rise Time | 2 | 1 | nsec |
| 10% Duration | W−2 | 2 | nsec |
| Peak Power | 1 | 0.05 | normalized power |

Figure 25A:
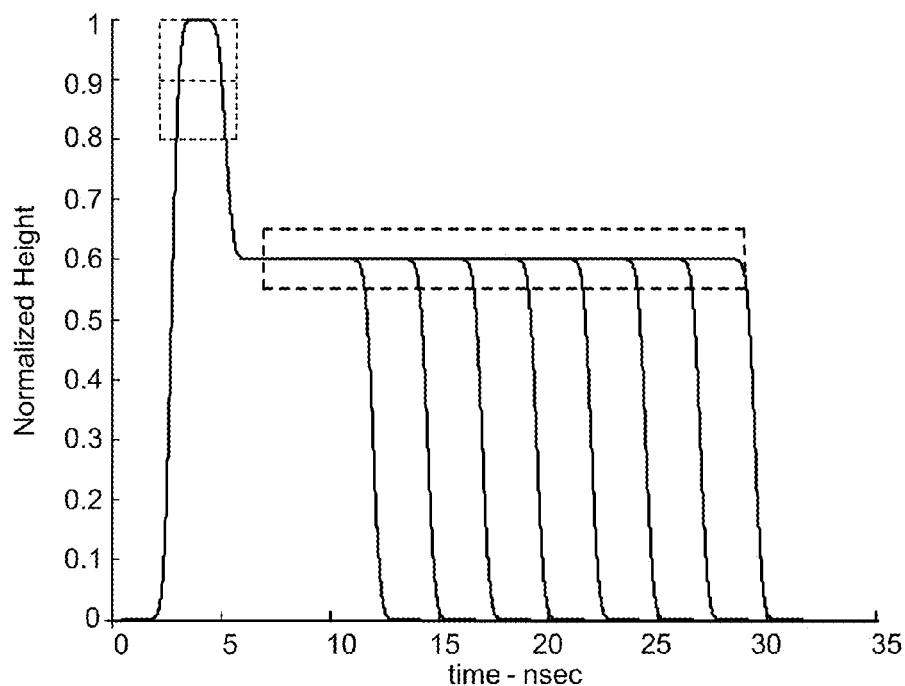
FIG. 25A graphically illustrates a plurality of tailored laser pulses as specified according to Table 2 according to one embodiment.
Figure 25B:
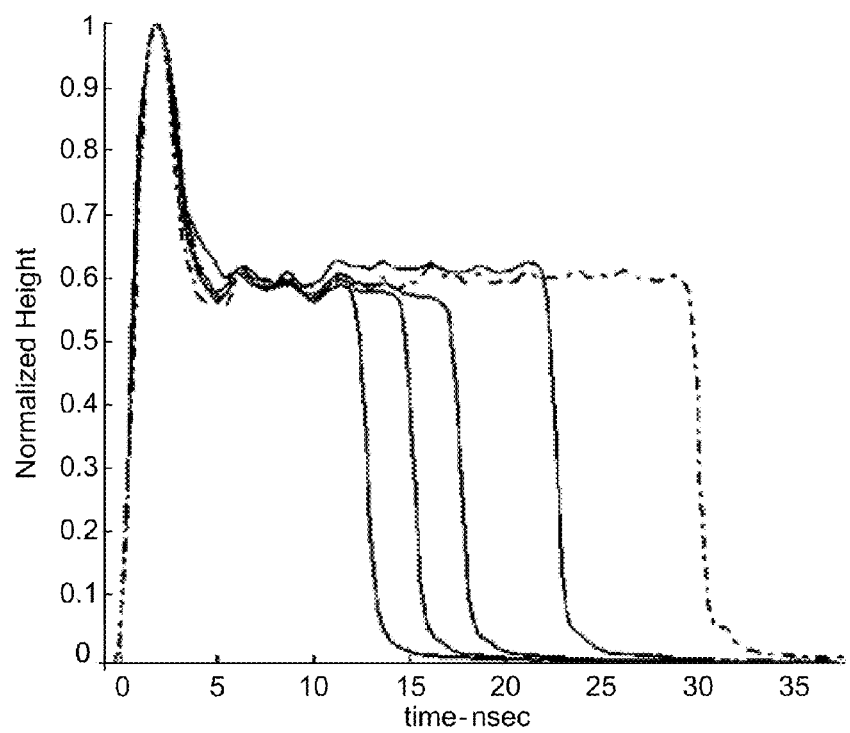
FIGS. 25B and 25C illustrate additional examples of tailored laser pulses according to certain embodiments.
Figure 25C:
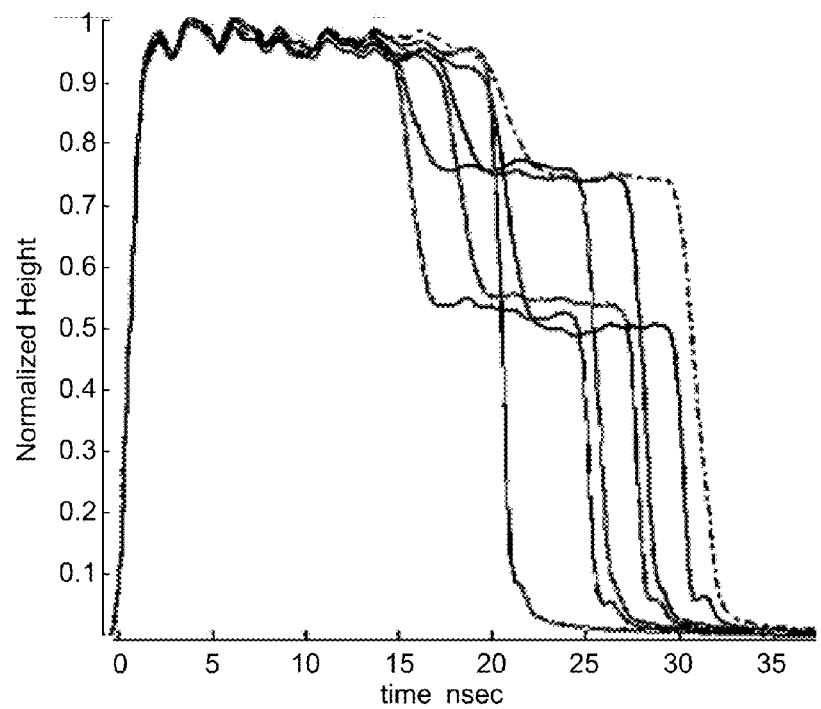

In Table 2, W is the chair width and may be varied to define a set of pulse shapes with different chair widths. For example, FIG. 25A graphically illustrates a plurality of tailored pulses (eight shown) as specified according to Table 2 with respective widths W=12.5, 15, 17.5, 20, 22.5, 25, 27.5, and 30. The values and tolerances shown in Table 2 define the characteristics of a spike within a first box 1610 and a plateau (with respective lengths W) within a second box 1612. FIGS. 25B and 25C illustrate additional examples of tailored laser pulses generated by a laser system according to certain embodiments.

4. Example Pulse Profiler

Figure 26:
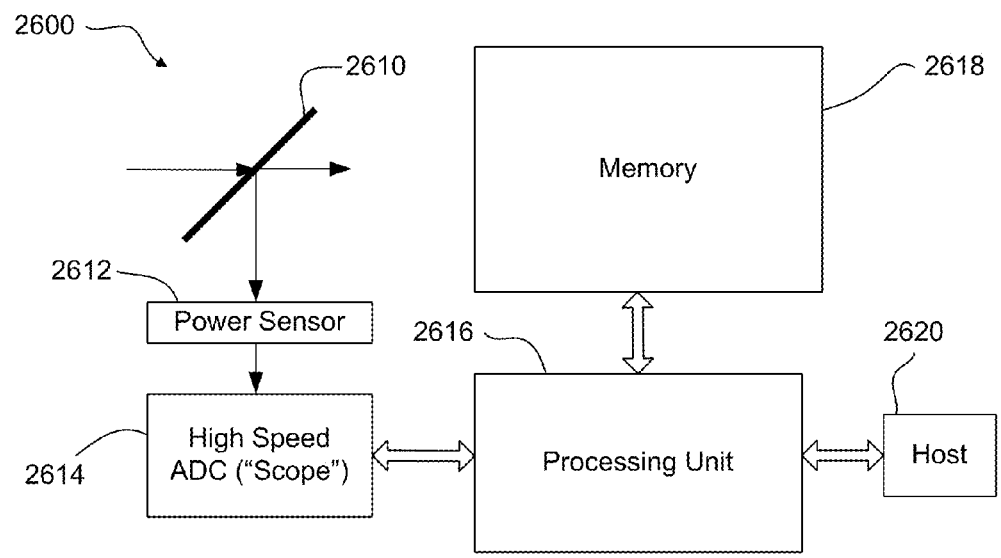
FIG. 26 is a block diagram of an example pulse profiler configured to provide feedback metrics of pulse shapes according to one embodiment.

FIG. 26 is a block diagram of an example pulse profiler 2600 configured to provide feedback metrics of pulse shapes according to one embodiment. The example pulse profiler 2600 includes an optical splitter 2610, a power sensor 2612, a high speed analog-to-digital converter (ADC) 2614 or "scope," a processing unit 2616, and a memory device 2618. In one embodiment, the processing unit 2616 is in communication with a host device 2620.

The optical splitter 2610 is configured to receive a laser pulse before it is delivered to a work surface, and to direct a portion of the laser pulse to the power sensor 2612. The analog output of the power sensor 2612 is provided to the high speed ADC 2614 to be properly conditioned and digitized. The power sensor 2612 and/or the high speed ADC 2614 may include appropriate logic to handle triggering on the relatively fast pulse shape (e.g., total temporal width of approximately 50 ns), which in some embodiments is received at a pulse repetition rate of approximately 100 kHz.

The high speed ADC 2614 provides data to the processing unit 2616 corresponding to the individual pulses. The processing unit 2616 filters the data and uses the filtered data to compute one or more of the metrics described above. The processing unit 2616 may send the computed metrics to the host 2620 for process monitoring and, in some embodiments, process control. The memory device 2618 is configured to record the data corresponding to the temporal pulse shapes and/or the corresponding computed metrics. In one embodiment, the data corresponding to the temporal pulse shapes are loaded into a circular buffer (not shown) and retrieved offline for study of the actual pulse shapes as opposed to runtime monitoring of the pulse shape metrics.

The pulse profiler 2600 may periodically or continuously compute the feedback metrics through either an automatic procedure or in response to a user command. The pulse profiler 2600 may compute the feedback metrics on every generated laser pulse, a large fraction of the generated laser pulses, or a small fraction of the generated laser pulses. The pulse profiler 2600 may also compute the feedback metrics when an external metric, such as a fixed-to-attempted ratio deviates from a normal or expected value.

When analysis of pulse shape data using the feedback metrics described above indicates that a pulse shape is non-optimal or is not within specified tolerances, the system may perform one or more corrective actions. For example, the system may display a warning to indicate that a pulse shape calibration is desired. In addition, or in another embodiment, the system may interrupt processing, prompt a user (e.g., a service engineer) to adjust the pulse shape, and restart processing.

In another embodiment, as discussed below, the system may automatically calculate one or more laser system input parameters to produce an improved pulse shape. The system may automatically implement these reconfigured parameters. In addition, or in another embodiment, the system may prompt a user (e.g., an operator or service engineer) to implement the automatically calculated system input parameters.

B. Pulse Shape Control

As discussed above, the information provided from pulse shape feedback may be used in many different ways with respect to pulse shape control. When providing multiple laser processing systems to a particular user, the process developed on one system may be reproduced on the other systems. Thus, according to one embodiment, each system is configured to reproduce the same nominal pulse shapes. The feedback provided by the various systems may be used to adjust the respective lasers as required during laser processing of a material or during a pulse shape setup procedure configured to provide this reproduction.

The information may also be used to provide pulse shape stability over time. For fiber laser or MOFPA based tailored pulse systems, for example, the pulse shape may distort as a function of the laser power available from the laser head. Or, the distortion may be due to degradation of laser system components, such as pump diodes or gain modules. Thus, runtime feedback is used in certain embodiments to adjust the pulse shapes periodically to maintain stability over time.

In one embodiment, an iterative learning method is used for pulse shape control. In the iterative learning algorithm, a waveform that is expected to repeat is compared to a nominal waveform and small adjustments are made to the appropriate control parameters until the measured shape converges to the nominal shape. The iterative learning algorithm is very effective at reproducing waveforms in non-linear environments and is particularly well suited to adjusting control parameters of tailored pulse shapes.

In certain embodiments, repetitive control techniques may be used to generate laser pulses with desired pulse shapes. Repetitive control/repetitive feed forward (FF) control uses an adaptive, evolving, or learning element to produce a desired outcome (e.g., pulse shape) from an input signal (e.g., a voltage applied to an acousto-optic deflector, an acousto-optic modulator, an electro-optic defector, or an electro-optic modulator) that can be changed to provided different pulse temporal profiles. Input parameters may also be controlled to program a laser power supply that is configured to receive amplitude commands in different bin command signals. Repetitive control may achieve a desired outcome even if the relationship between input and output is nonlinear.

In certain embodiment, a user is allowed to input a desired pulse shape, repetitive control techniques converge on the proper input signals to achieve this pulse shape, and a laser is appropriately configured. In addition, or in other embodiments, through application of repetitive control, system-to-system and laser-to-laser variability may be reduced or eliminated. Further, long-term/mid-term transient effects such as thermal shifts or degradation effects may be tuned out through application of repetitive control techniques. This type of tuning technique may be applied to any laser in which the output is shaped in terms of amplitude and/or time. The tuning technique may also be applied to fiber lasers, MOFPAs, or other types of lasers. The tuning technique may be applied in an occasional calibration step or continuously during system operation.

V. Example "Sliced" Pulse Laser

Figure 27:
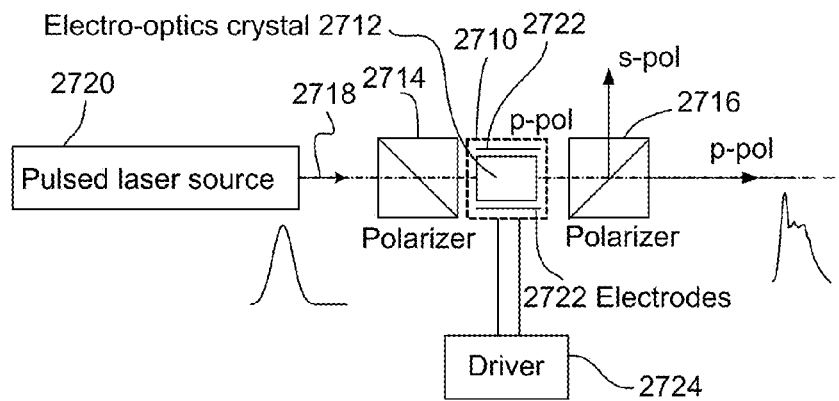
FIG. 27 is a simplified block diagram of an electro-optical modulator operating as a laser pulse slicing device in the production of tailored laser pulse output according to one embodiment.

FIG. 27 shows an electro-optical modulator 2710 that may be implemented in laser pulse "slicing" systems according to certain embodiments to produce tailored laser pulse output. The electro-optical modulator 2710 includes an electro-optical crystal 2712 cell that is positioned between light polarizing devices (polarizers) 2714 and 2716 and receives a beam of laser pulses 2718 emitted by a pulsed laser source 2720. The electro-optical crystal cell 2712 has electrodes 2722 to which drive output signals of driver circuitry 2724 are applied to contribute to shaping of incident laser pulses 2718. The laser source 2720 can be any pulsed laser emitting a laser pulse of a pulse width within a range of a few nanoseconds to 100 ns. The electro-optical crystal cell 2712 can be made of KDP, KD*P, ADP, AD*P, RTP, RTA, BBO, LiNbO$_3$, or other electro-optical materials. One example of a suitable electro-optical crystal cell 2712 is a LightGate 4 BBO Pockels cell manufactured by Cleveland Crystals, Inc., of Highland Heights, Ohio. The LightGate 4 cell can operate at 100 KHz, and its geometry minimizes the drive voltage to about 1.3 KV quarter-wave retardation at 355 nm. The LightGate 4 cell has only 4 pf capacitance, which provides a possibility of less than 2 ns rise and fall optical response times. One example of suitable driver circuitry 2724 is a high-voltage, fast switching time Pockels cell driver that is available from Bergmann Messegeraete Entwicklung, K G, Murnau, Germany.

A BBO based electro-optical modulator 2710 operates as a quarter-wave rotator in response to a quarter-wave drive voltage applied to electrodes 2722 of RTP cell 2712. The pulsed laser beam 2718 passes through the polarizer 2714 to become p-polarized (p-pol) as shown. The laser beam 2718 travels once through the BBO crystal cell 2712. When no drive voltage is applied to the electrodes 2722 of the BBO crystal cell 2712, the laser pulses remain in the p-pol state and pass through the polarizer 2716. When a quarter-wave drive voltage at the laser wavelength is applied to electrodes 2722 of the BBO crystal cell 2712, the polarization direction of the beam rotates 90 degrees and become s-polarized (s-pol). When a drive voltage applied to electrodes 2722 of BBO crystal cell 2712 is between 0 and the quarter-wave voltage, the portion of polarized laser beam 2718 transmitted from polarizer 2716 is approximately expressed as $$T=\sin^2[(\pi/2)(V/V_{1/2})],$$

where T is the transmission of the laser beam from the polarizer 2716, V is the voltage applied to the electrodes 2722 of the electro-optical crystal cell 2712, and $V_{1/2}$ is the half-wave voltage.

Figure 28:
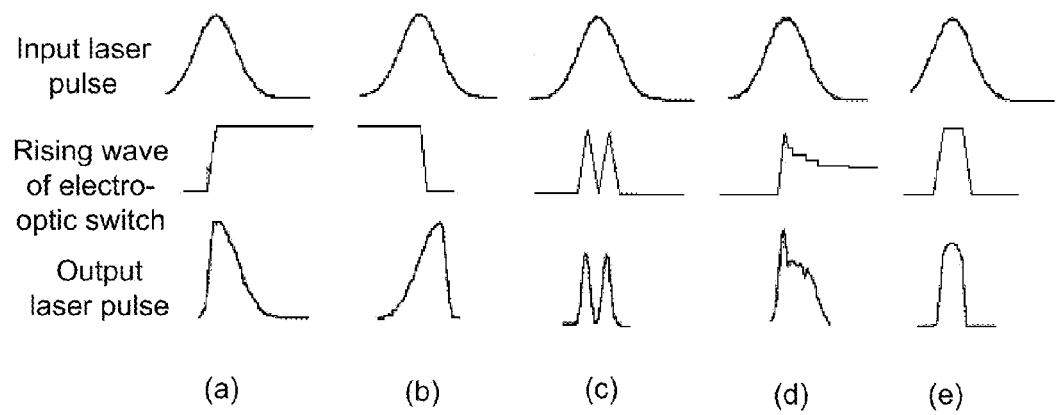
FIG. 28 shows in columns (a), (b), (c), (d), and (e) examples of five possible laser pulse shape formations produced by the laser pulse slicing device of FIG. 27.

Based on the above expression, the controllable transmission, T, of the electro-optical modulator 2710 provides a laser pulse shaping function. Theoretically, the transmission of the electro-optical crystal cell 2712 and the polarizers 2714, 2716 can be about 0%-100%. FIG. 28 shows five examples of possible laser pulse shapes. FIG. 28 shows as column (a) one example of pulse shaping, in which the transmission changes from 0% to 100% with less than a 2 ns rise time for the laser pulse to reach its peak and thereby provide a fast rising leading edge of the laser pulse. Skilled persons will recognize that in an alternative arrangement, known to the art as a double-pass configuration, a quarter-wave voltage may be employed to achieve a desired level of polarization rotation but that this improved efficiency is scheduled gained at the expense of greater optical alignment complexity.

Rise and fall times are related to the voltage and capacitance of the electro-optical cell, the switching time of drive circuit transistors, the repetition rates, and overall electrical power consumption. Lower voltage and capacitance of the electro-optical cell contribute to its fast response time; therefore, selection of a proper material for the electro-optical cell is important. Skilled persons will recognize that BBO and RTP exhibit useful material characteristics for implementation in electro-optical modulators. Koechner, *Solid-State Laser Engineering*, Springer-Verlag, states, for a longitudinal electro-optical cell in which the electric field is applied parallel to the crystal optic axis and in the same direction as the incident light, that phase difference, $\delta$, is related to the applied voltage in a crystal of length, l, by $$\delta=(2\pi/\lambda)n_0^3 r_{63} V_z,$$

where $V_z=E_z l$.

To obtain half-wave retardation, a Pockels cell produces a phase difference $\delta=\pi$. In this case, for linearly polarized light incident on the Pockels cell, the output beam is also linearly polarized but with a plane of polarization rotated by 90 degrees. By incorporation of polarizing optics well known in the art, the Pockels cell can function as a voltage-controlled optical modulator. Koechner expresses the transmission, T, dependence of such a device as:

$$T=\sin^2[(\pi/2)(V/V_{1/2})],$$

where the half-wave voltage is given by $V_{1/2}=\lambda/2n_o^3 r_{63}$.

For a transverse electro-optical crystal cell, in which the electric field is applied perpendicularly to the direction of the beam, the half-wave voltage is given by $$V_{1/2}=\lambda d/2n_0^3 r_{63} l.$$

This type of electro-optical crystal cell has the useful attribute that the half-wave voltage depends on the ratio of crystal thickness to length and, by proper selection of these parameters, electro-optical crystal cells may be designed that operate at lower applied voltages than those applied to longitudinal electro-optical crystal cells to achieve a given phase difference.

Skilled persons will recognize that the term $r_{63}$ in the above equations represents the electro-optic coefficient for phosphates of the KDP family. RTP crystal is an important member of this family and is a preferred electro-optical crystal material for the preferred embodiments described for use with 1064 nm laser input. BBO crystal is preferably used with 355 nm laser input.

RTP crystal has a low voltage requirement (about 1.6 KV for $\pi$ or half-wave retardation and a 3.5 mm aperture) for 1064 nm laser input and can operate to a 10 MHz repetition rate. RTP crystal cannot perform well when the average power is generally more than 10 W or is not suitable for UV applications because of transparency restrictions. For these latter applications as noted above, BBO is preferred. In practice, it is difficult to drive BBO at 100 KHz for 1064 nm laser because of the high voltage requirement (about 6 KV at half-wave retardation). Therefore, the RTP electro-optical crystal cell is the currently preferred choice for a 1064 nm laser, and the BBO electro-optical crystal cell is preferred for 355 nm laser (about 1.3 KV at half-wave retardation for a LightGate 4 BBO Pockels cell). Other electro-optical materials, such as KDP, RTA, and ADP, have main limitations on use at high repetition rates and pulse modulation because of piezo-electric (PE) resonances. Faster rise and fall times result in higher frequency components, so there is a greater chance that one of these frequency components will fall into the principal resonance frequencies. This is especially true of a fast rise time tailored pulse, which contains many frequency components that extend in frequency well above the fundamental repetition rate.

To generate tailored pulse shapes, the embodiments are implemented with a "fast multi-state" (FMS) electro-optical modulator that is designed to avoid PE resonances. For 1064 nm laser output, this is accomplished by using an electro-optical cell made of RTP crystal material and short electrical pulses, which do not generate significant PE resonances. Pulse lengths on the order of nanoseconds result in relatively low PE resonances. For example, an RTP electro-optical crystal cell can reach a repetition rate of 10 MHz for 5% duty cycle pulses.

Another concern of obtaining fast rising and falling time is the design of the electro-optical modulator driver. There is no actual limitation of an electro-optical crystal cell preventing it from producing sub-nanosecond or picosecond switching times; therefore, a fast switching time depends mainly on the electrical driver. Skilled persons recognize that there are two principal types of electrical switchers: avalanche transistor and MOSFET. The transistors operate within a very limited voltage range to attain the fastest switching time. A stack of 7 to 10 transistors may be used to operate in the 1.6 KV range. Avalanche transistors can achieve a 2 ns switching time, but their repetition rates are limited to less than 10 KHz. For higher repetition rates, MOSFETs are currently preferred, because, generally, they have a 1 ns response time and maximum 1 KV operating voltage. A stack of at least 2 to 3 MOSFETs is used to operate in the 1.6 KV range.

The selection of MOSFETs and circuit design are, therefore, germane to accomplish FMS pulse modulation. In particular, the driver circuit power consumption is of concern because it is proportional to the square of the peak operating voltage. For example, a BBO electro-optical cell operating at about 6 KV requires approximately 1814 times as much power consumption as that of an RTP electro-optical cell operating at 1.6 KV to achieve a comparable phase shift at a given repetition rate. Skilled persons will recognize that lowering the operating voltage reduces the power consumption. It is possible to reduce the number of MOSFETs, which in turn provides better performance of FMS pulse modulation through judicious choice of the aperture size and resulting drive voltage. In one embodiment of a transverse electro-optical modulator, a reduction in the apertures of RTP and BBO electro-optical crystal cells to about 2 mm gives corresponding reductions in half-wave retardation voltages to about 800 V and 4 KV at 1064 nm, for RTP and BBO electro-optical crystal cells, respectively.

An FMS electro-optical modulator is capable of multiple programmable steps of modulation, in which each step has a rise time of less than about 4 ns and a fall time of less than about 4 ns, and more preferably, in which each step has a rise time of less than about 2 ns and a fall time of less than about 2 ns. An operational advantage of the disclosed embodiments is that they provide a tailored pulse shape that may be programmed to have more than one amplitude value. Another such operational advantage is the capability of providing programmable tailored pulse shapes with discrete amplitude and time duration components. Such capability is particularly useful in the production of tailored pulse output with a pulse shape of the type shown in FIG. 28(a). This pulse shape has, with respect to the first amplitude maximum, a total fall time that is substantially longer than the rise time to the first amplitude maximum.

Embodiments may be implemented with one or more electro-optical modulators receiving drive signals that selectively change the amount of incident pulsed laser emission to form a tailored pulse output. Triggering the drive signal from the pulsed laser emission suppresses jitter associated with other stages of the system and substantially removes jitter associated with pulsed laser emission build-up time. The tailored pulses can be power-scaled for harmonic generation to shorter wavelengths.

It will be understood by those having skill in the art that many changes may be made to the details of the above-described embodiments without departing from the underlying principles of the invention. The scope of the present invention should, therefore, be determined only by the following claims.

The invention claimed is:

1. A method for processing a workpiece with a laser, the method comprising:
   storing data corresponding to a plurality of temporal pulse profiles, each temporal pulse profile associated with a respective target class of structure on or within the workpiece, wherein one of the plurality of temporal pulse profiles comprises a triangular shape that increases at a first constant rate from an initial power value at a first time to a peak power value at a second time and decreases at a second constant rate from the peak power value at the second time back to the initial power value at a third time;
   selecting a structure on or within the workpiece for processing, the selected structure being associated with the temporal pulse profile comprising the triangular shape;
   selecting the first constant rate to control a rate of heating the selected structure during a period between the first time and the second time;
   selecting the second constant rate to control a rate of cooling the selected structure during a period between the second time and the third time, wherein the second constant rate is different than the first constant rate;
   based on the selected structure, selecting the temporal pulse profile comprising the triangular shape from among the plurality of temporal pulse profiles;
   generating a laser pulse comprising the selected temporal pulse profile; and
   directing the generated laser pulse to the workpiece so as to process the selected structure with the generated laser pulse.

2. The method of claim 1, further comprising:
   associating the temporal pulse profile comprising the triangular shape with a target class comprising unpassivated electrically conductive link structures, wherein the selected structure is within the associated target class.

3. The method of claim 2, wherein directing the generated laser pulse to the workpiece so as to process the selected structure comprises severing an unpassivated electrically conductive link structure with the generated laser pulse comprising the triangular temporal pulse profile.

4. The method of claim 1, further comprising:
   associating the temporal pulse profile comprising the triangular shape with a target class comprising a bare metal formed over a substrate.

5. The method of claim 4, wherein directing the generated laser pulse to the workpiece so as to process the selected structure comprises scribing a portion of the bare metal.

6. The method of claim 1, further comprising:
   selecting the first constant rate to be substantially greater than the second constant rate based on characteristics of the associated target class of structure.

7. The method of claim 1, further comprising:
selecting the first constant rate to be substantially less than the second constant rate based on characteristics of the associated target class of structure.

8. The method of claim 1, further comprising:
selecting at least one of the second time and the third time based on characteristics of the associated target class of structure.

9. A laser processing system for processing a workpiece, the system comprising:
a memory device storing data corresponding to a plurality of temporal pulse profiles, each temporal pulse profile associated with a respective target class of structure on or within the workpiece, wherein one of the plurality of temporal pulse profiles comprises a triangular shape that increases at a first constant rate from an initial power value at a first time to a peak power value at a second time and decreases at a second constant rate from the peak power value at the second time back to the initial power value at a third time;
a controller configured to:
select a structure on or within the workpiece for processing, the selected structure being associated with the temporal pulse profile comprising the triangular shape;
select the first constant rate to control a rate of heating the selected structure during a period between the first time and the second time;
select the second constant rate to control a rate of cooling the selected structure during a period between the second time and the third time, wherein the second constant rate is different than the first constant rate; and
select, based on the selected structure, the temporal pulse profile comprising the triangular shape from among the plurality of temporal pulse profiles;
a laser source for generating a laser pulse comprising the selected temporal pulse profile; and
optics for directing the generated laser pulse to the workpiece so as to process the selected structure with the generated laser pulse.

10. The system of claim 9, wherein the memory device stores data that associates the temporal pulse profile comprising the triangular shape with a target class comprising unpassivated electrically conductive link structures, wherein the selected structure is within the associated target class.

11. The system of claim 10, wherein directing the generated laser pulse to the workpiece so as to process the selected structure comprises severing the unpassivated electrically conductive link structures with the generated laser pulse comprising the triangular temporal pulse profile.

12. The system of claim 9, wherein the memory device stores data that associates the temporal pulse profile comprising the triangular shape with a target class comprising a bare metal formed over a substrate.

13. The system of claim 12, wherein directing the generated laser pulse to the workpiece so as to process the selected structure comprises scribing a portion of the bare metal.

14. The system of claim 9, wherein the controller is further configured to select the first constant rate to be substantially greater than the second constant rate based on characteristics of the associated target class of structure.

15. The system of claim 9, wherein the controller is further configured to select the first constant rate to be substantially less than the second constant rate based on characteristics of the associated target class of structure.

16. The system of claim 9, wherein the controller is further configured to select at least one of the second time and the third time based on characteristics of the associated target class of structure.

17. A method for processing unpassivated electrically conductive link structures of a semiconductor device, each unpassivated electrically conductive link structure including bottom and top surfaces, the bottom surfaces being positioned adjacent a passivation layer or semiconductor substrate, and the top surfaces being bare so as to allow direct illumination by laser pulses during laser processing, the method comprising:
selecting an unpassivated electrically conductive link structure from among the unpassivated electrically conductive link structures of the semiconductor device;
generating, using a laser processing system, a laser pulse comprising a triangular-shaped temporal pulse profile that increases at a first constant rate from an initial power value at a first time to a peak power value at a second time and decreases at a second constant rate from the peak power value at the second time back to the initial power value at a third time;
selecting the first constant rate to control a rate of heating the electrically conductive link structure during a period between the first time and the second time; and
selecting the second constant rate to control a rate of cooling the electrically conductive link structure during a period between the second time and the third time; and
directing the generated laser pulse to the selected unpassivated electrically conductive link structure.

18. The method of claim 17, further comprising:
selecting the first constant rate to be substantially greater than the second constant rate based on characteristics of the selected electrically conductive link structure.

19. The method of claim 17, further comprising:
selecting the first constant rate to be substantially less than the second constant rate based on characteristics of the selected electrically conductive link structure.

20. The method of claim 17, further comprising:
selecting at least one of the second time and the third time based on characteristics of the selected electrically conductive link structure.

* * * * *